US012672433B2

(12) United States Patent
Lee et al.

(10) Patent No.: US 12,672,433 B2
(45) Date of Patent: Jun. 30, 2026

(54) DISPLAY DEVICE

(71) Applicant: Samsung Display Co., LTD., Yongin-si (KR)

(72) Inventors: Sang Duk Lee, Yongin-si (KR); Hyun A Lee, Seoul (KR); Mi Sun Kim, Hwaseong-si (KR); Sun Ok Oh, Hwaseong-si (KR); Ki Kyung Youk, Bucheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 627 days.

(21) Appl. No.: 17/735,489

(22) Filed: May 3, 2022

(65) Prior Publication Data

US 2022/0392979 A1 Dec. 8, 2022

(30) Foreign Application Priority Data

Jun. 8, 2021 (KR) ........................ 10-2021-0074268

(51) Int. Cl.
H10K 59/131 (2023.01)
H10K 59/122 (2023.01)
(Continued)

(52) U.S. Cl.
CPC ......... H10K 59/122 (2023.02); H10W 72/221 (2026.01); H10W 72/232 (2026.01);
(Continued)

(58) Field of Classification Search
CPC .............. H10K 59/122; H10K 59/131; H10K 59/1275; H10K 71/50; H01L 24/05;

H01L 24/06; H01L 24/13; H01L 24/14; H01L 24/16; H01L 24/29; H01L 24/32; H01L 24/73; H01L 24/91; H01L 2224/0401; H01L 2224/05573; H01L 2224/06141; H01L 2224/06151; H01L 2224/13006; H01L 2224/13014; H01L 2224/13144;

(Continued)

(56) References Cited

U.S. PATENT DOCUMENTS 9,831,432 B2 11/2017 Im
10,886,348 B2 1/2021 Kim et al.
(Continued)

FOREIGN PATENT DOCUMENTS

JP 2008203484 A * 9/2008
JP 2012-215892 11/2012
(Continued)

*Primary Examiner* — Christine S. Kim
*Assistant Examiner* — Sesha Sairaman Srinivasan
(74) *Attorney, Agent, or Firm* — F. CHAU & ASSOCIATES, LLC

(57) ABSTRACT

A display device comprises a display panel including a display area including pixels, and a pad area adjacent to the display area, and a driving integrated circuit mounted on the pad area, wherein the pad area includes a stud pad area located at an edge of the pad area and including at least one stud pad electrode, the driving integrated circuit includes a circuit base, and at least one stud bump area overlapping the stud pad area in a thickness direction of the display device and including at least one stud bump, and the at least one stud pad electrode overlaps an edge portion of the at least one stud bump.

21 Claims, 23 Drawing Sheets

(51) Int. Cl.

| | |
|---|---|
| *H10K 59/127* | (2023.01) |
| *H10K 71/50* | (2023.01) |
| *H10W 72/20* | (2026.01) |
| *H10W 72/29* | (2026.01) |
| *H10W 72/30* | (2026.01) |
| *H10W 72/90* | (2026.01) |
| *H10W 74/15* | (2026.01) |
| *H10W 90/00* | (2026.01) |
| *H10W 99/00* | (2026.01) |

(52) U.S. Cl.
CPC ........ *H10W 72/248* (2026.01); *H10W 72/252* (2026.01); *H10W 72/29* (2026.01); *H10W 72/321* (2026.01); *H10W 72/90* (2026.01); *H10W 72/9445* (2026.01); *H10W 74/15* (2026.01); *H10W 90/722* (2026.01); *H10W 90/732* (2026.01); *H10W 99/00* (2026.01)

(58) Field of Classification Search
CPC . H01L 2224/13147; H01L 2224/13184; H01L 2224/14151; H01L 2224/14179; H01L 2224/16145; H01L 2224/29006; H01L 2224/32145; H01L 2224/73204; H01L 2224/9211; H01L 2021/60195; G09G 3/006; G09G 2300/043; G09G 2330/12; G09G 3/2092; G09G 2300/0426; G09G 2380/02; G09G 3/3241
See application file for complete search history.

(56) References Cited

U.S. PATENT DOCUMENTS

| | | | | |
|---|---|---|---|---|
| 2009/0250812 A1* | 10/2009 | Araki | ...................... | H01L 24/11 |
| | | | | 257/E23.06 |
| 2016/0105952 A1* | 4/2016 | Park | .................... | G02F 1/13338 |
| | | | | 349/12 |
| 2016/0143174 A1* | 5/2016 | Cho | ........................ | H05K 3/323 |
| | | | | 174/251 |
| 2017/0098769 A1* | 4/2017 | Im | .......................... | H10K 71/70 |
| 2019/0348487 A1* | 11/2019 | Kim | .................... | H10K 59/131 |

FOREIGN PATENT DOCUMENTS

| | | |
|---|---|---|
| JP | 2012-227480 | 11/2012 |
| JP | 2020-131639 | 8/2020 |
| KR | 10-0559649 | 3/2006 |
| KR | 10-2011-0072043 | 6/2011 |
| KR | 10-1082893 | 11/2011 |
| KR | 10-2017-0039813 | 4/2017 |
| KR | 10-2018-0043872 | 5/2018 |
| KR | 10-2018-0128548 | 12/2018 |
| KR | 10-2019-0130091 | 11/2019 |

* cited by examiner

ILa: ILa_1, ILa_2

DISPLAY DEVICE

CROSS-REFERENCE TO RELATED APPLICATION(S)

This application claims priority to and benefits of Korean Patent Application No. 10-2021-0074268 under 35 U.S.C. 119, filed on Jun. 8, 2021 in the Korean Intellectual Property Office, the entire contents of which are herein incorporated by reference.

BACKGROUND

1. Technical Field

The disclosure relates to a display device.

2. Description of the Related Art

Recently, due to the development of technology, display products that are smaller and lighter and have better performance have been produced. In the past, a cathode ray tube (CRT) having many advantages in terms of performance and cost has been widely used. However, flat panel display devices (e.g., a plasma display device, a liquid crystal display (LCD) device, an organic light emitting display (OLED) device, a quantum dot light emitting display (QLED) device, or the like) are popular and have solved drawbacks of the CRT in terms of miniaturization and portability. Flat panel display devices feature advantages such as miniaturization, weight reduction, low power consumption and the like.

A display device may include a display panel displaying an image and a driving integrated circuit mounted on the display panel. The driving integrated circuit may be provided in the form of a driving chip.

SUMMARY

Aspects of the disclosure provide a display device capable of preventing cracks in wires located around an attachment area between a driving integrated circuit and a display panel.

According to an embodiment, a display device may include a display panel including a display area including pixels, and a pad area adjacent to the display area, and a driving integrated circuit mounted on the pad area, wherein the pad area includes a stud pad area located at an edge of the pad area and including at least one stud pad electrode, the driving integrated circuit may include a circuit base, and at least one stud bump area overlapping the stud pad area in a thickness direction of the display device and including at least one stud bump, and the at least one stud pad electrode may overlap an edge portion of the at least one stud bump.

According to another embodiment, the pad area may further include an output pad area adjacent to the display area and including output pad electrodes, and an input pad area located below the output pad area in a plan view and including input pad electrodes.

According to another embodiment, the at least one stud pad electrode may include stud pad patterns separated from each other with a separation space between the stud pad patterns in a plan view, and the stud pad patterns may overlap the edge portion of the at least one stud bump in the thickness direction.

According to another embodiment, the stud pad patterns may not overlap a center portion of the at least one stud bump in the thickness direction.

According to another embodiment, at least one stud pad pattern may include a portion that does not overlap the at least one stud bump in the thickness direction.

According to another embodiment, the stud pad patterns may be disposed in a closed loop shape in a plan view.

According to another embodiment, the stud pad patterns may be symmetrical with respect to a direction in a plan view.

According to another embodiment, the display panel may further include a base substrate, and at least one inorganic layer on the base substrate. The at least one inorganic layer may include a stud hole penetrating in the thickness direction between the stud pad patterns symmetrical with respect to the direction, wherein a side surface of the at least one inorganic layer may be exposed through the stud hole.

According to another embodiment, the at least one stud bump may fill the stud hole, and the at least one stud bump may directly contact at least one of the stud pad patterns.

According to another embodiment, the at least one stud bump may directly contact a top surface and a side surface of the at least one of the stud pad patterns, and the at least one stud bump may directly contact the side surface of the at least one inorganic layer exposed through the stud hole.

According to another embodiment, the at least one stud bump may be ultrasonically bonded to the at least one of the stud pad patterns.

According to another embodiment, at least one of the input pad electrodes, at least one of the output pad electrodes, and at least one of the stud pad patterns may be located on a same layer.

According to another embodiment, the driving integrated circuit may include an output bump area overlapping the output pad area in the thickness direction and including output bumps, and an input bump area overlapping the input pad area in the thickness direction and including input bumps. The at least one stud bump area may be located outside the output bump area and the input bump area in a plan view.

According to another embodiment, a shape of the driving integrated circuit in a plan view may be a rectangular shape including long sides extending in a first direction and short sides extending in a second direction intersecting the first direction, and the at least one stud bump area may be located between the output bump area and a short side of the driving integrated circuit in a plan view.

According to another embodiment, the at least one stud bump area may include stud bump areas, a shape of the driving integrated circuit in a plan view may have four corners formed by the long sides and the short sides, and the stud bump areas may be located adjacent to the four corners.

According to another embodiment, a shape of the driving integrated circuit in a plan view may include edges located between one of the long sides and one of the short sides adjacent to each other and extending in a direction different from the one of the long sides and the one of the short sides, the at least one stud bump area may include stud bump areas, and the stud bump areas are located adjacent to the edges.

According to another embodiment, each one of the edges may have a round shape.

According to another embodiment, at least one of the input bumps and at least one of the input pad electrodes may directly contact each other, and a non-conductive adhesive member may be disposed between the at least one of the input bumps and another one of the input bumps adjacent thereto and between the at least one of the input pad electrodes and another of the input pad electrodes adjacent thereto.

According to another embodiment, a display device may include a display area including pixels, a first pad area adjacent to the display area, and a second pad area farther from the display area than the first pad area in a plan view, wherein the first pad area may include an output pad area adjacent to the display area and including output pad electrodes, an input pad area located below the output pad area in a plan view and including input pad electrodes; and a stud pad area located at an edge of the first pad area and including one or more stud pad electrodes, and the one or more stud pad electrodes may include stud pad patterns separated from each other with a separation space between the one or more stud pad electrodes in a plan view, the stud pad patterns may be arranged in a closed loop shape in a plan view, the output pad area includes at least one resistance measurement pad, the second pad area includes at least one resistance test point pad, and the resistance measurement pad and the resistance test point pad may be electrically connected through a resistance measurement line.

According to another embodiment, the at least one resistance measurement pad may be disposed between the output pad electrodes in a plan view, and the at least one resistance test point pad may be disposed between the input pad electrodes in a plan view.

According to another embodiment, the stud patterns may have a symmetrical shape with respect to a direction in a plan view.

However, aspects of the disclosure are not restricted to the one set forth herein. The above and other aspects of the disclosure will become more apparent to one of ordinary skill in the art to which the disclosure pertains by referencing the detailed description of the disclosure given below.

In accordance with an embodiment, it is possible to provide a display device in which a peripheral area that may be a non-display area may be reduced.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
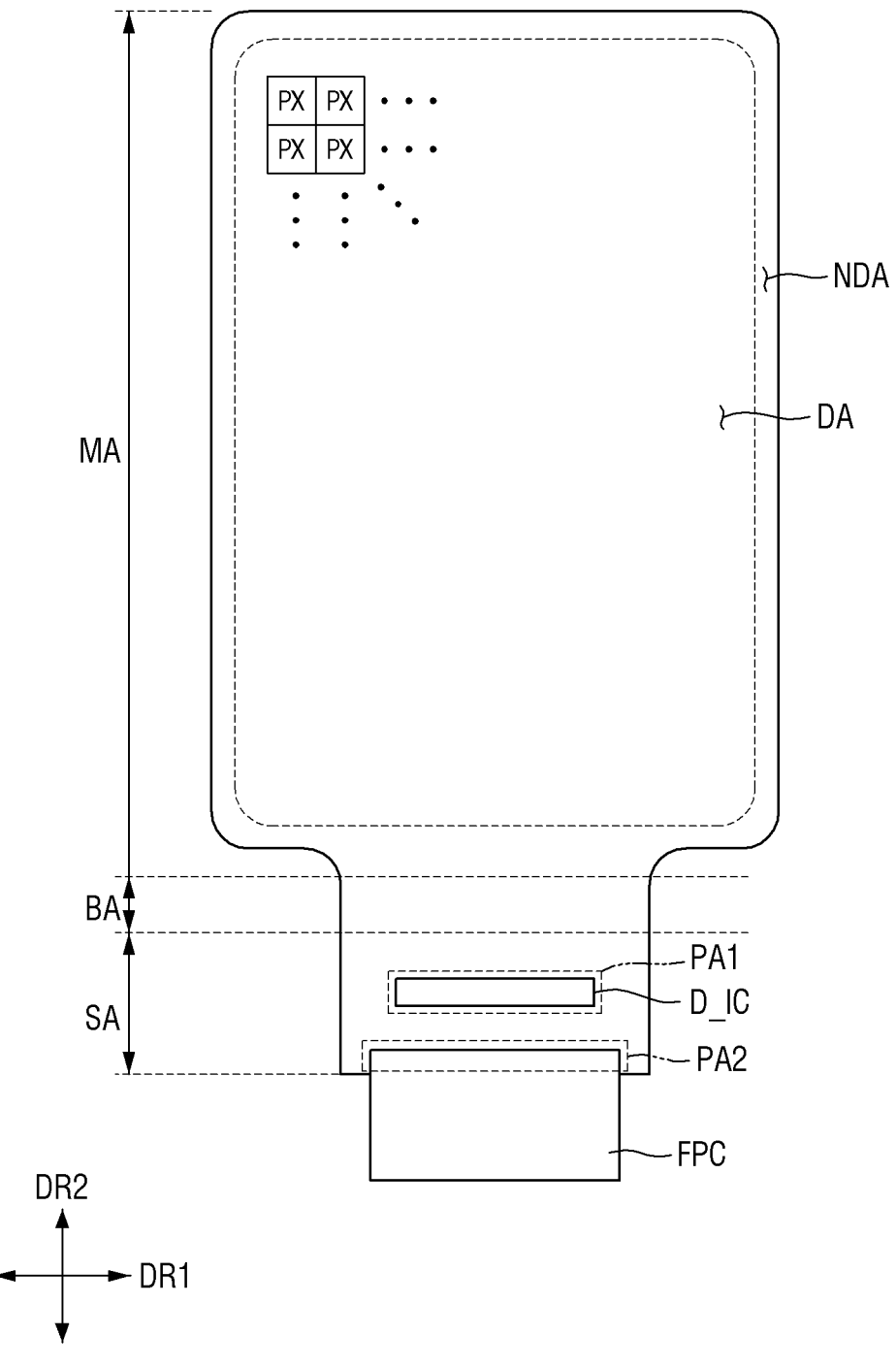
FIG. 1 is a schematic plan view of a display device according to an embodiment.

Specific structural and functional descriptions of embodiments of the disclosure disclosed herein are only for illustrative purposes of the embodiments. The disclosure may be embodied in many different forms without departing from the spirit and characteristics of the disclosure. Therefore, the embodiments of the disclosure are disclosed only for illustrative purposes and should not be construed as limiting the disclosure.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there may be no intervening elements present. Other expressions that explain the relationship between elements, such as "between," "directly between," "adjacent to," or "directly adjacent to," should be construed in the same way. Further, it will be understood that the terms "connected to" or "coupled to" may include a physical or electrical connection or coupling.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." It will be further understood that the terms "comprises", "comprising," "has", "having", "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Hereinafter, embodiments of the disclosure will be described with reference to the attached drawings.

FIG. 1 is a schematic plan view of a display device according to an embodiment.

Referring to FIG. 1, the display device may include a display area DA where an image may be displayed and a non-display area NDA adjacent to the display area DA. The display area DA may include pixels PX. The non-display area NDA may include no pixel PX. The non-display area NDA may include a first peripheral area surrounding the display area DA, and a second peripheral area protruding downward from the first peripheral area. The second peripheral area may include a bending area BA, a first pad area PA1 where a driving integrated circuit D_IC may be located, and a second pad area PA2 where a printed circuit film FPC may be located.

The first pad area PA1 may be disposed between the bending area BA and the second pad area PA2 in plan view.

The display area DA may have a quadrilateral shape on a plane defined by a first direction DR1 and a second direction DR2 perpendicular to the first direction DR1, and the corners of the display area DA may be rounded. However, the disclosure is not limited thereto, and they may be angled.

As shown in FIG. 1, the first peripheral area may include a left first peripheral area adjacent to the left side of the display area DA, a right first peripheral area adjacent to the right side of the display area DA, an upper first peripheral area adjacent to the upper side of the display area DA, and a lower first peripheral area adjacent to the lower side of the display area DA.

The width of the second peripheral area may be smaller than the width of the first peripheral area. However, the disclosure is not limited thereto, and the width of the second peripheral area may be equal to or greater than the width of the first peripheral area. The second peripheral area may be connected to the lower first peripheral area.

The bending area BA may be a portion where the display device may be folded.

The above-described driving integrated circuit D_IC may be connected to the first pad area PA1. The driving integrated circuit D_IC may be provided in the form of a drive chip. Multiple first pad electrodes connected to the driving integrated circuit D_IC may be disposed in the first pad area PA1.

The printed circuit film FPC including a timing controller may be connected to the second pad area PA2. Multiple second pad electrodes connected to the printed circuit film FPC may be disposed in the second pad area PA2.

On the other hand, the areas of the display device according to an embodiment may be divided into the display area DA and the non-display area NDA, but they may be divided into a main area MA, a sub-area SA, and the bending area BA depending on the bent shape of the display device.

The main area MA may include the display area DA, the first peripheral area around the display area DA, and the area between the lower first peripheral area and the bending area BA in the second peripheral area. The sub-area SA may include the area located on the other side in the second direction DR2 with respect to the bending area BA in the second peripheral area.

Figure 2A:
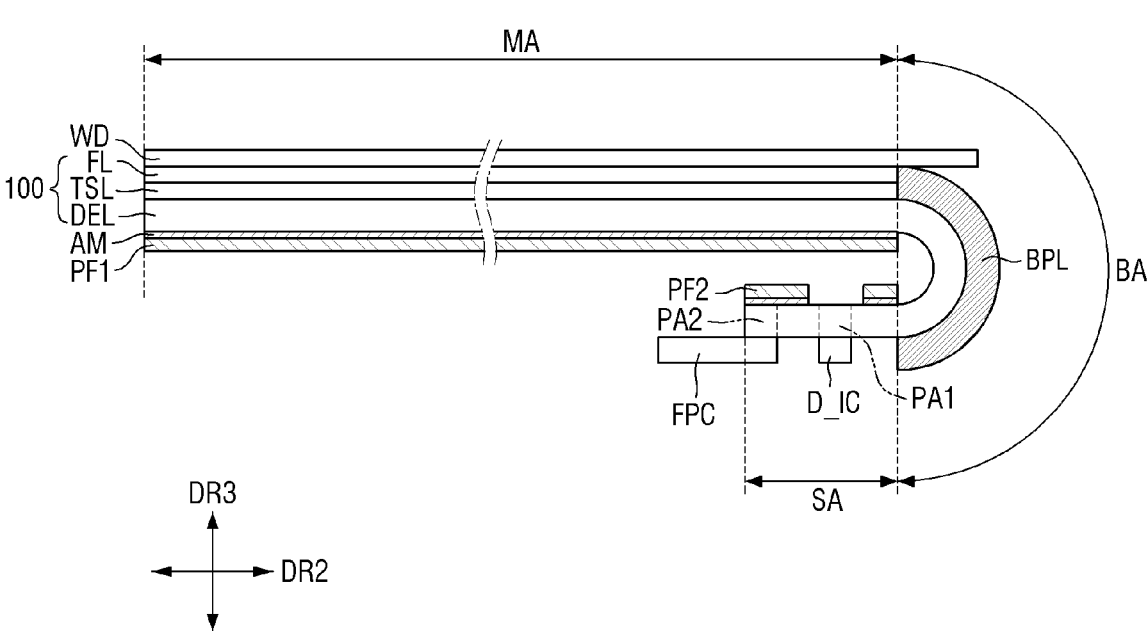
FIG. 2A is a schematic cross-sectional view showing a state in which a display device according to an embodiment is bent.

FIG. 2A is a schematic cross-sectional view showing a state in which a display device according to an embodiment is bent.

Referring to FIGS. 1 and 2A, the main area MA of the display device according to an embodiment may overlap the sub-area SA in a thickness direction. The display device according to an embodiment may include a display panel 100 and a cover window WD located on the display panel 100.

Examples of the display panel 100 may include an organic light emitting display panel, a micro LED display panel, a nano LED display panel, a quantum dot light emitting display panel, a liquid crystal display panel, a plasma display panel, a field emission display panel, an electrophoretic display panel, an electrowetting display panel, and the like. In the following, a case where an organic light emitting display panel is applied as the display panel will be discussed, but the disclosure is not limited thereto, and other display panels may be applied.

The display panel 100 may include a display element layer DEL. As shown in FIG. 2A, the bottom surface of the main area MA of the display element layer DEL according to an embodiment may face the bottom surface of the sub-area SA of the display element layer DEL. The top surface of the main area MA of the display element layer DEL may face a side in the third direction DR3, and the top surface of the sub-area SA of the display element layer DEL may face the another side in the third direction DR3.

The display device according to an embodiment may further include lower films PF1 and PF2 under the display element layer DEL. The first lower film PF1 may be disposed under the main area MA of the display element layer DEL, and the second lower film PF2 may be disposed (disposed between the sub-area SA and the first lower film PF1 in a cross-sectional view of a bent state) under the sub-area SA of the display element layer DEL.

Each of the lower films PF1 and PF2 may be attached to the display element layer DEL via an adhesive member AM. The lower films PF1 and PF2 may respectively support the main area MA and the sub-area SA of the display element layer DEL in the bent state of the display device according to an embodiment.

Each of the lower films PF1 and PF2 may include a rigid or semi-rigid material. Specifically, each of the lower films PF1 and PF2 may include a metal material such as stainless steel (SUS) and aluminum, or a polymer such as polymethyl methacrylate (PMMA), polycarbonate (PC), polyvinyl alcohol (PVA), acrylonitirle-butadiene-styrene (ABS), polyethylene terephthalate (PET), and the like. For example, each of the lower films PF1 and PF2 may be a stainless steel film having a thickness of about 150 μm to about 200 As another example, each of the lower films PF1 and PF2 may be an aluminum film having a thickness of about 150 μm to about 200 μm.

The display panel 100 according to an embodiment may further include a touch sensor layer TSL disposed on the display element layer DEL. The touch sensor layer TSL may be disposed on the display element layer DEL. FIG. 2A illustrates that the touch sensor layer TSL may be included in the display panel 100 and may be directly disposed on a thin film encapsulation layer (see 170 of FIG. 5) of the display panel 100. The touch sensor layer TSL may be substantially disposed on the main area MA. However, unlike that shown in FIG. 2A, the touch sensor layer TSL may be formed as a separate member from the display panel 100 including the display element layer DEL and attached to the display panel 100.

A cover window WD may be disposed on the touch sensor layer TSL. The cover window WD may include glass or plastic. The cover window WD may overlap the main area MA of the display panel 100, and a part of the cover window WD may extend to the bending area BA.

The display panel 100 according to an embodiment may further include a separate member for reducing reflection of external light. An example of the separate member may be a filter layer FL. The filter layer FL may include color filters. For example, the color filters may include red, green, and blue color filters. Each of the color filters may be disposed in each emission area of the pixel PX of FIG. 1. The filter layer FL may further include a light blocking pattern located between the adjacent color filters. The light blocking pattern may be, for example, a black matrix, but is not limited thereto.

For example, the display panel 100 may further include the filter layer FL disposed on the touch sensor layer TSL. The filter layer FL may serve to reduce reflection of external light incident from the upper side of the cover window WD.

The display panel 100 according to an embodiment may further include a bending protection layer BPL disposed on the display element layer DEL in the bending area BA. The bending protection layer BPL may serve to alleviate bending stress occurring in the bending area BA.

Figure 2B:
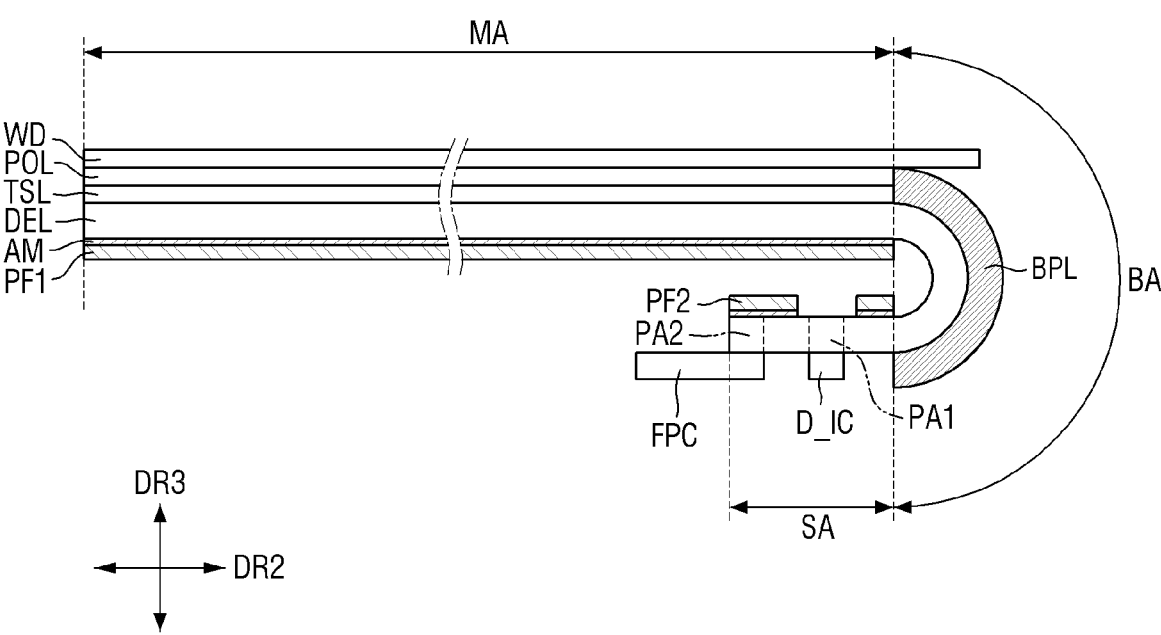
FIG. 2B is a schematic cross-sectional view of a display device in a bent state according to a modified example.

FIG. 2B is a schematic cross-sectional view of a display device in a bent state according to a modified example. FIG. 2B illustrates a case in which a separate member for reducing reflection of external light may be a polarization member POL. The polarization member POL may be located between the touch sensor layer TSL and the cover window WD to reduce reflection of external light incident from the upper side of the cover window WD. The polarization member POL may be attached to the touch sensor layer TSL via a separate adhesive layer or tackifying layer. The polarization member POL may be substantially disposed on the main area MA.

Figure 3:
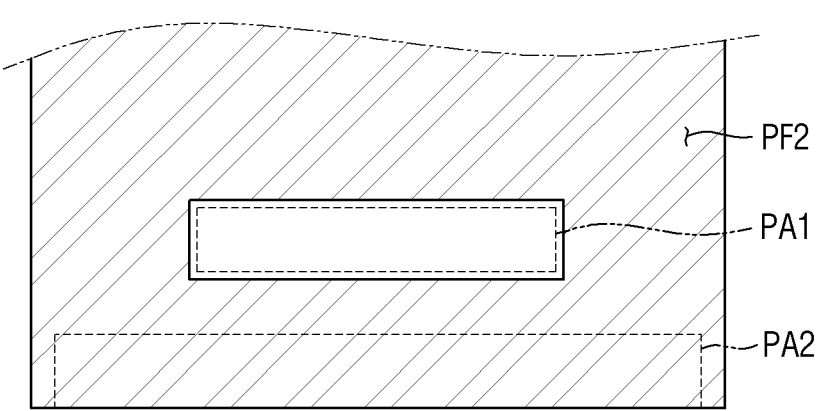
FIG. 3 is a schematic plan view of the second lower film of the display device according to FIG. 1.
Figure 3:
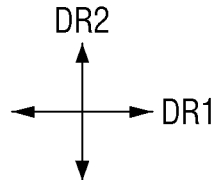

FIG. 3 is a schematic plan view of the second lower film of the display device according to FIG. 1.

Referring to FIGS. 2A, 2B and 3, the second lower film PF2 may not be disposed in a region of the sub-area SA, which overlaps the driving integrated circuit D_IC in the thickness direction. For example, the second lower film PF2 may not overlap the first pad area PA1.

Bumps of the driving integrated circuit D_IC may be ultrasonically bonded to the pad electrodes of the first pad area PA1, and the ultrasonic bonding may be executed by a bonding device. The bonding device may transfer vibration energy to the bumps of the driving integrated circuit D_IC while moving by ultrasonic vibrations. The bumps, which have received the vibration energy, may move in the vibration direction with respect to the facing pad electrodes, thereby generating frictional heat between the bumps and the pad electrodes. The bumps and the pad electrodes that face each other may be directly bonded to each other by the frictional heat.

However, in the first pad area PA1, in case that the second lower film PF2 is further disposed under the display panel 100, the frictional heat generated between the bumps and the pad electrodes may not be used for bonding only the facing bumps to pad electrodes, and may be absorbed by the second lower film PF2.

Accordingly, in the case of the display device according to an embodiment, the second lower film PF2 may not overlap the first pad area PA1, so that frictional heat generated between the bumps and the pad electrodes may be used for bonding only the facing bumps to pad electrodes. Accordingly, there may be an advantage of increasing bonding efficiency.

Figure 4:
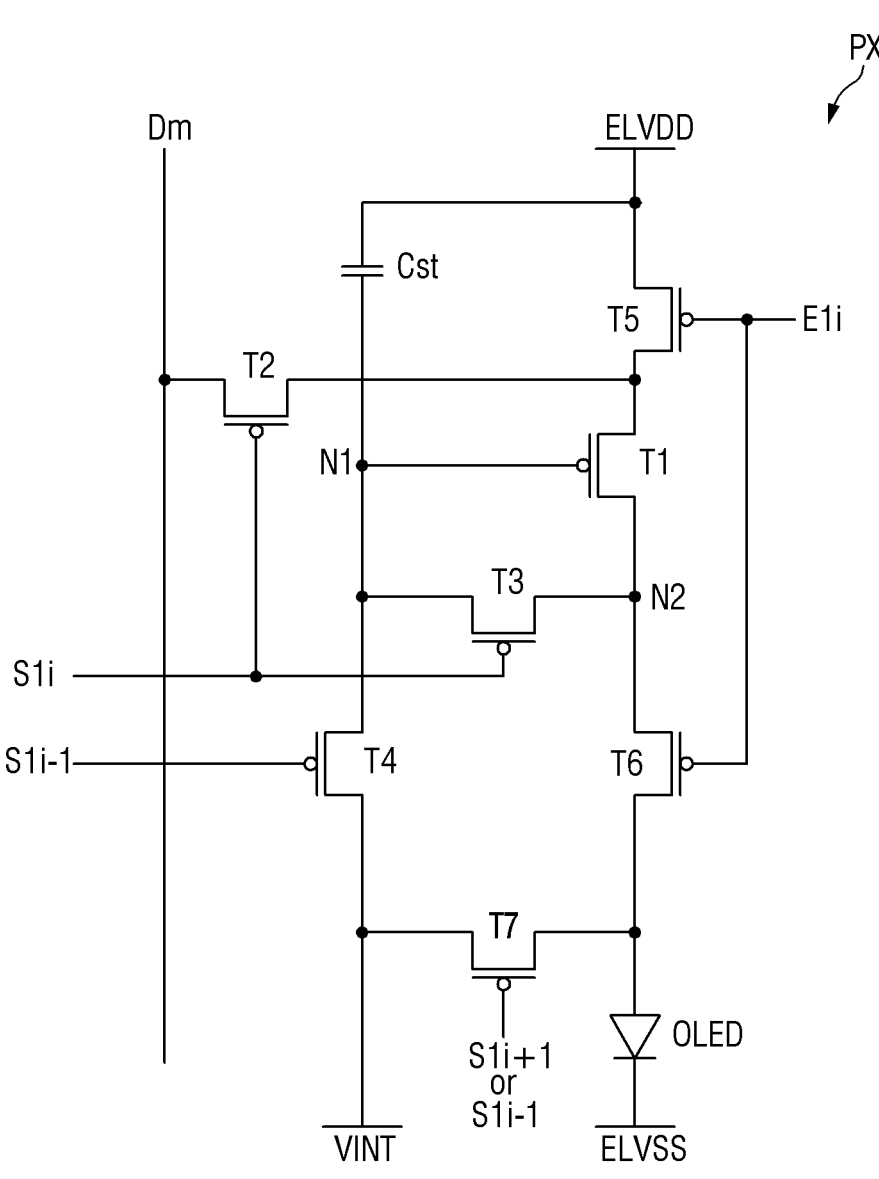
FIG. 4 is a schematic diagram showing an embodiment of a pixel shown in FIG. 1.

FIG. 4 is a schematic diagram showing an embodiment of a pixel shown in FIG. 1.

Referring to FIG. 4, the pixel connected to an $m^{th}$ data line Dm and an $i^{th}$ first scan line S1$i$ is illustrated for simplicity of description.

The pixel PX according to an embodiment of the disclosure may include an organic light emitting diode OLED, first to seventh transistors T1 to T7, and a storage capacitor Cst.

The anode of the organic light emitting diode OLED may be connected to the first transistor T1 through the sixth transistor T6, and the cathode of the organic light emitting diode OLED may be connected to the second power source ELVSS. This organic light emitting diode OLED may generate light having a luminance corresponding to the amount of current supplied from the first transistor T1.

The first power source ELVDD may be set to a higher voltage than the second power source ELVSS so that a current may flow toward the organic light emitting diode OLED.

The seventh transistor T7 may be connected between an initialization power supply VINT and the anode of the organic light emitting diode OLED. The gate electrode of the seventh transistor T7 may be connected to an $(i+1)^{th}$ first scan line S1$i$+1 or an $(i-1)^{th}$ first scan line S1$i$-1. In case that the scan signal is supplied to the $i^{th}$ first scan line S1$i$, the seventh transistor T7 may be turned on to supply the voltage of the initialization power supply VINT to the anode of the organic light emitting diode OLED. Here, the initialization power supply VINT may be set to a lower voltage than the data signal.

The sixth transistor T6 may be connected between the first transistor T1 and the organic light emitting diode OLED. Further, the gate electrode of the sixth transistor T6 may be connected to an $i^{th}$ first emission control line E1$i$. The sixth transistor T6 may be turned off in case that the emission control signal is supplied to the $i^{th}$ first emission control line E1$i$ and turned on in other cases.

The fifth transistor T5 may be connected between the first power supply ELVDD and the first transistor T1. The gate electrode of the fifth transistor T5 may be connected to the $i^{th}$ first emission control line E1$i$. The fifth transistor T5 may be turned off in case that the emission control signal is supplied to the $i^{th}$ first emission control line E1$i$ and turned on in other cases.

The first electrode of the first transistor T1 (driving transistor) may be connected to the first power supply ELVDD through the fifth transistor T5, and the second electrode of the first transistor T1 may be connected to the anode of the organic light emitting diode OLED through the sixth transistor T6 (e.g., and a second node N2). Further, the gate electrode of the first transistor T1 may be connected to a first node N1. The first transistor T1 may control the amount of current flowing from the first power supply ELVDD to the second power supply ELVSS through the organic light emitting diode OLED in response to the voltage of the first node N1.

The third transistor T3 may be connected between the second electrode of the first transistor T1 and the first node N1. The gate electrode of the third transistor T3 may be connected to the $i^{th}$ first scan line S1$i$. In case that the scan signal is supplied to the $i^{th}$ first scan line S1$i$, the third transistor T3 may be turned on to electrically connect the second electrode of the first transistor T1 to the first node N1. Therefore, in case that the third transistor T3 is turned on, the first transistor T1 may be connected in the form of a diode.

The fourth transistor T4 may be connected between the first node N1 and the initialization power supply VINT. Further, the gate electrode of the fourth transistor T4 may be connected to the $(i-1)^{th}$ first scan line S1$i$-1. In case that the scan signal is supplied to the $(i-1)^{th}$ first scan line S1$i$-1, the fourth transistor T4 may be turned on to supply the voltage of the initialization power supply VINT to the first node N1.

The second transistor T2 may be connected between the $m^{th}$ data line Dm and the first electrode of the first transistor T1. Further, the gate electrode of the second transistor T2 may be connected to the $i^{th}$ first scan line S1$i$. In case that the scan signal is supplied to the $i^{th}$ first scan line S1$i$, the second transistor T2 may be turned on to electrically connect the $m^{th}$ data line Dm to the first electrode of the first transistor T1.

The storage capacitor Cst may be connected between the first power supply ELVDD and the first node N1. The storage capacitor Cst may store the data signal and the voltage corresponding to the threshold voltage of the first transistor T1.

Figure 5:
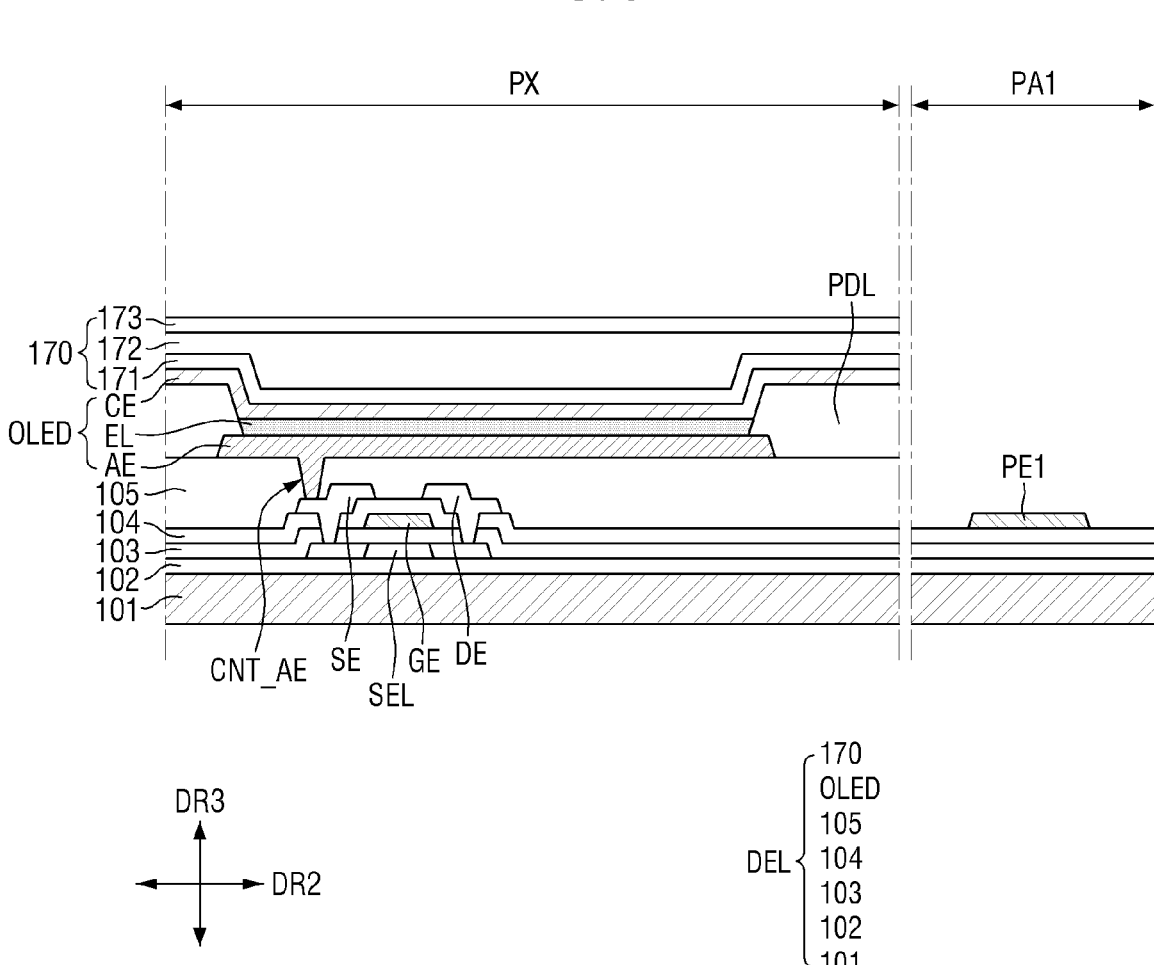
FIG. 5 is a schematic cross-sectional view of a pixel and a first pad area of FIG. 1.

FIG. 5 is a schematic cross-sectional view of a pixel and a first pad area of FIG. 1. FIG. 5 illustrates a specific cross-sectional structure of the display element layer DEL of FIG. 2A.

Referring to FIG. 5, the display element layer (see DEL of FIG. 2A, 2B) according to an embodiment may include a base substrate 101, a buffer layer 102, an active layer SEL, a first gate insulating layer 103, a first gate conductive layer including a gate electrode GE and a first pad electrode PE1, an interlayer insulating layer 104, a data conductive layer including a source electrode SE, a drain electrode DE, and a second pad electrode PE2, a via layer 105, an organic light emitting diode OLED, a pixel defining layer PDL, and a thin film encapsulation layer 170.

The buffer layer 102, the active layer SEL, the first gate insulating layer 103, the first gate conductive layer including the gate electrode GE and the first pad electrode PE1, the interlayer insulating layer 104, the data conductive layer including the source electrode SE and the drain electrode DE may form a circuit element layer. The pixel defining layer PDL and the organic light emitting diode OLED may form a light emitting element layer.

The base substrate 101 may include a transparent insulating substrate. For example, the base substrate 101 may be a flexible transparent resin substrate. The transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, or the like, or a combination thereof. In an embodiment, the base substrate 101 may be a polyimide (PI) resin film.

The buffer layer 102 may prevent a phenomenon that metal atoms or impurities may be diffused from the base substrate 101, and may control a heat transfer rate in a crystallization process for forming the active layer SEL to be described later to form a substantially uniform active layer SEL. Further, in case that the surface of the base substrate 101 is not uniform, the buffer layer 102 may serve to improve flatness of the surface of the base substrate 101. The buffer layer 102 may be formed using a silicon compound such as silicon oxide (SiOx), silicon nitride (SiNx), silicon oxynitride (SiOxNy), silicon oxycarbide (SiOxCy), silicon carbonitride (SiCxNy), or a combination thereof.

Although not shown, the buffer layer 102 may not be formed in the bending area BA. In other words, the buffer layer 102 may not be formed in the bending area BA or may be removed. This may be because the bending area BA may be a folded portion in a final product and, thus, damage such as cracks or the like may occur in the buffer layer 102 in case that the buffer layer 102 that may be an inorganic layer is formed in the bending area BA. Similarly, the insulating layers 103, 104 and the like that may be inorganic layers may not be formed in the bending area BA.

The active layer SEL may be disposed on the buffer layer 102. The active layer SEL may include a drain region and a source region that may be doped with impurities, and a channel region disposed between the drain region and the source region.

The first gate insulating layer 103 may be disposed on the buffer layer 102 on which the active layer SEL may be disposed. The first gate insulating layer 103 may include a silicon compound, a metal oxide, or the like, or a combination thereof.

The first gate conductive layer may be disposed on the gate insulating layer 120. The first gate conductive layer may include the gate electrode GE of the thin film transistor, a signal line such as a gate line for transmitting a signal for driving a pixel, the first pad electrode PE1, and the like. The first gate conductive layer may be made of a metal, an alloy, metal nitride, conductive metal oxide, a transparent conductive material, or the like, or a combination thereof. For example, the first gate conductive layer may be made of a metal such as copper, aluminum, molybdenum, or the like, or a combination thereof. Further, the first gate conductive layer may have a layered structure of multiple layers. For example, the first gate conductive layer may include a copper layer and a molybdenum layer disposed on the copper layer.

The interlayer insulating layer 104 may be disposed on the first gate conductive layer. The interlayer insulating layer 104 may be formed using a silicon compound such as silicon oxide (SiOx), silicon nitride (SiNx), silicon oxynitride (SiOxNy), silicon oxycarbide (SiOxCy), silicon carbonitride (SiCxNy), or a combination thereof.

The data conductive layer may be disposed on the interlayer insulating layer 104. The data conductive layer may include the source electrode SE and the drain electrode DE.

The source electrode SE may be connected to the source region through a contact hole penetrating the interlayer insulating layer 104 and the first gate insulating layer 103. The drain electrode DE may be connected to the drain region through a contact hole penetrating the interlayer insulating layer 104 and the first gate insulating layer 103.

The data conductive layer may be made of a metal, an alloy, metal nitride, conductive metal oxide, a transparent conductive material, or the like, or a combination thereof. For example, the data conductive layer may be made of a metal such as copper or aluminum having high conductivity. The data conductive layer may have a layered structure of multiple layers. For example, the data conductive layer may include a titanium layer, an aluminum layer on the titanium layer, and a titanium layer on the aluminum layer.

The via layer 105 may be disposed on the interlayer insulating layer 104 on which the data conductive layer may be disposed. The via layer 105 may include an organic insulating material, and may have a substantially flat top surface while sufficiently covering the data conductive layer. In some embodiments, the via layer 105 may include an inorganic insulating material.

The organic light emitting diode OLED may include a first electrode AE (or anode electrode), an organic light emitting layer EL, and a second electrode CE (or cathode electrode).

The anode electrode AE may be disposed on the via layer 105. The anode electrode AE may be electrically connected to the source electrode SE through contact holes CNT AE formed through the via layer 105.

The anode electrode AE may be formed using a reflective material or a light transmitting material. For example, the anode electrode AE may include aluminum, aluminum-containing alloy, aluminum nitride, silver, silver-containing alloy, tungsten, tungsten nitride, copper, copper-containing alloy, nickel, chromium, chromium nitride, molybdenum, molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like, or a combination thereof. These may be used alone or in combination with each other. In embodiments, the anode electrode AE may have a single layer structure or a multilayer structure including a metal layer, an alloy layer, a metal nitride layer, a conductive metal oxide layer and/or a transparent conductive material layer.

The pixel defining layer PDL may be disposed on the via layer 105 in which the anode electrode AE may be disposed. The pixel defining layer PDL may be made of an organic material, an inorganic material, or the like, or a combination thereof. For example, the pixel defining layer PDL may be made of a photoresist, a polyacrylic resin, a polyimide-based resin, an acrylic resin, a silicon compound, or the like, or a combination thereof. In accordance with embodiments, the pixel defining layer PDL may be etched to form an opening that partially exposes the anode electrode AE.

The organic light emitting layer EL may be disposed on the anode electrode AE exposed through the opening of the pixel defining layer PDL. Further, the organic light emitting layer EL may extend on the sidewall of the opening of the pixel defining layer PDL. In embodiments, the organic light emitting layer EL may have a multilayer structure including an organic layer, a hole injecting layer, a hole transporting layer, an electron transporting layer, an electron injecting layer, and the like.

In another embodiment, the hole injecting layer, the hole transporting layer, the electron transporting layer, and the electron injecting layer except the organic light emitting layer may be commonly formed to correspond to pixels PX.

The organic layer of the organic light emitting layer EL may be made of light emitting materials capable of generating different color lights such as red light, green light, blue light, and the like depending on the pixels PX of the display device. In accordance with other embodiments, the organic layer of the organic light emitting layer EL may have a structure in which light emitting materials capable of implementing different color lights such as red light, green light, blue light, and the like may be stacked to emit white light. At this time, the light emitting structures may be commonly formed to correspond to pixels PX, and the pixels may be distinguished by the color filter layer.

The second electrode CE (or cathode electrode) may be disposed on the pixel defining layer PDL and the organic light emitting layer EL. Depending on the light emitting method of the display device, the second electrode CE may include a light transmitting material or a reflective material. For example, the second electrode CE may include aluminum, aluminum-containing alloy, aluminum nitride, silver, silver-containing alloy, tungsten, tungsten nitride, copper, copper-containing alloy, nickel, chromium, chromium nitride, molybdenum, molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like, or a combination thereof. These may be used alone or in combination with each other. In embodiments, the second electrode CE may have a single layer structure or a multilayer structure including a metal layer, an alloy layer, a metal nitride layer, a conductive metal oxide layer and/or a transparent conductive material layer.

The thin film encapsulation layer 170 may be disposed on the second electrode CE. The thin film encapsulation layer 170 may prevent the permeation of external moisture and oxygen. The thin film encapsulation layer 170 may include at least one organic layer and at least one inorganic layer. At least one organic layer 172 and one or more inorganic layers 171 and 173 may be stacked alternately. For example, the thin film encapsulation layer 170 may, but not necessarily, include two inorganic layers 171 and 173 and one organic layer 172 disposed therebetween. In another embodiment, an encapsulation substrate may be provided, instead of the thin film encapsulation layer 170, to prevent external air and moisture from permeating into the display device.

Figure 6:
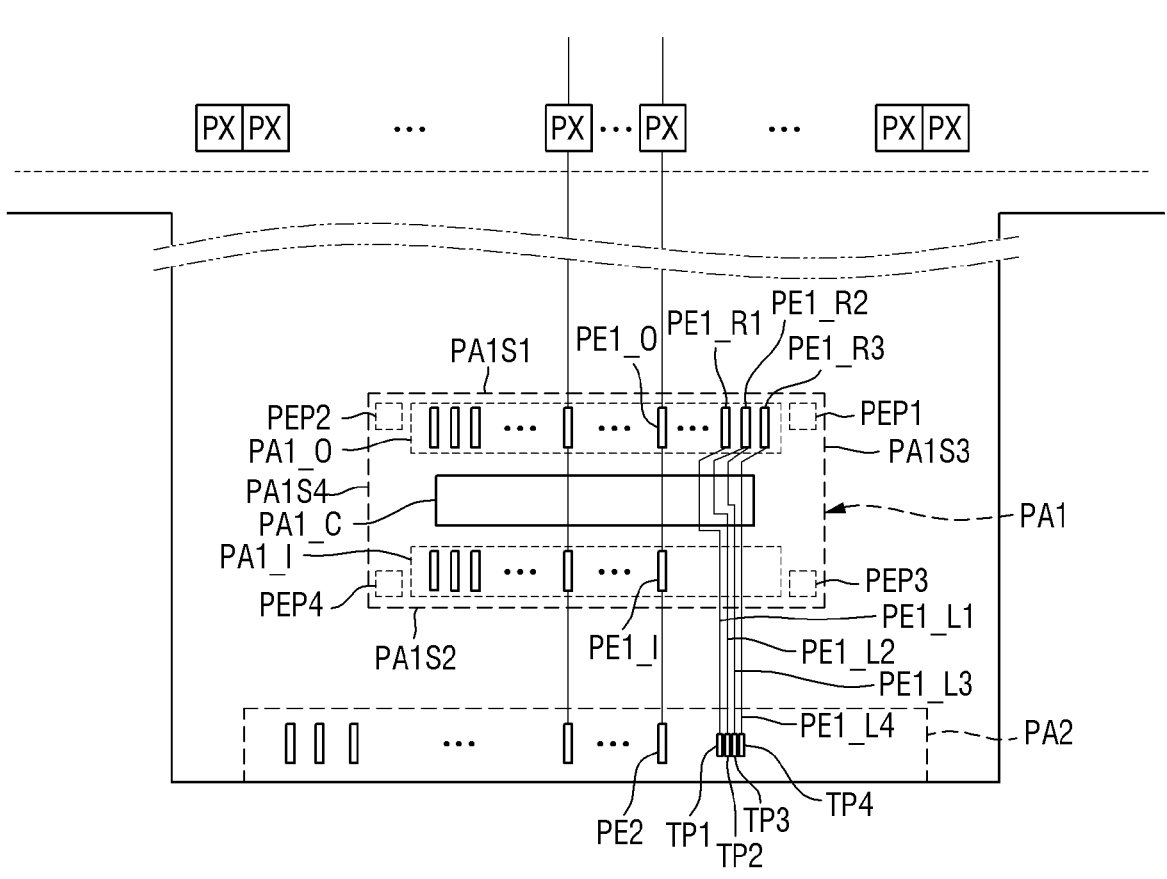
FIG. 6 is a schematic plan view specifically illustrating the first pad area and the second pad area of the display device of FIG. 1.
Figure 6:
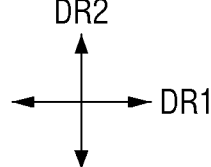
Figure 7:
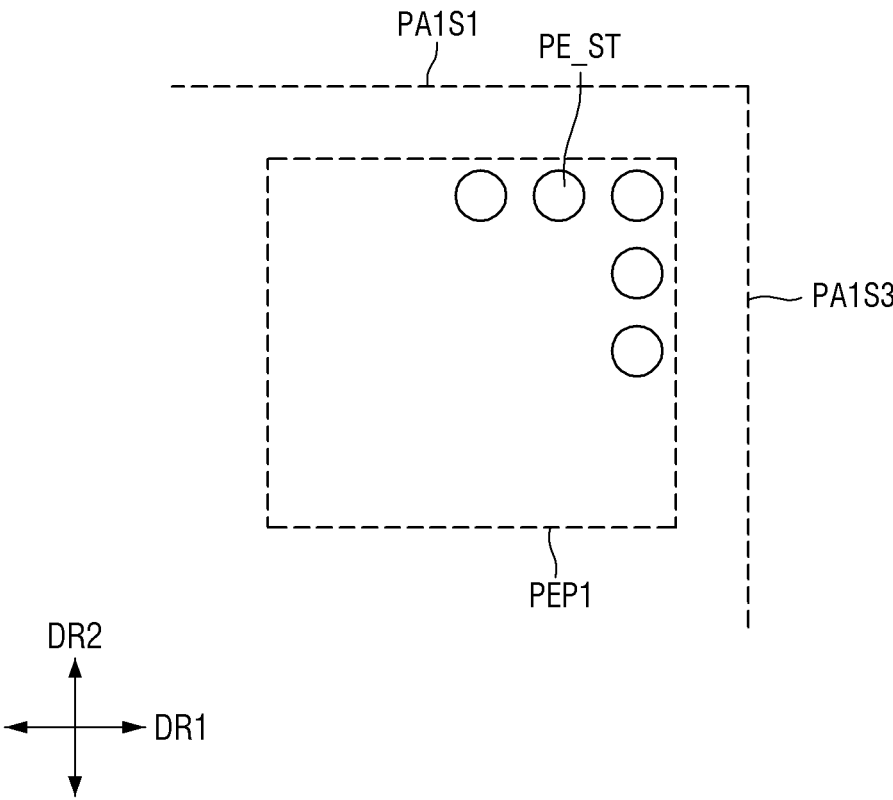
FIG. 7 is a schematic plan view showing a first stud pad area.
Figure 8:
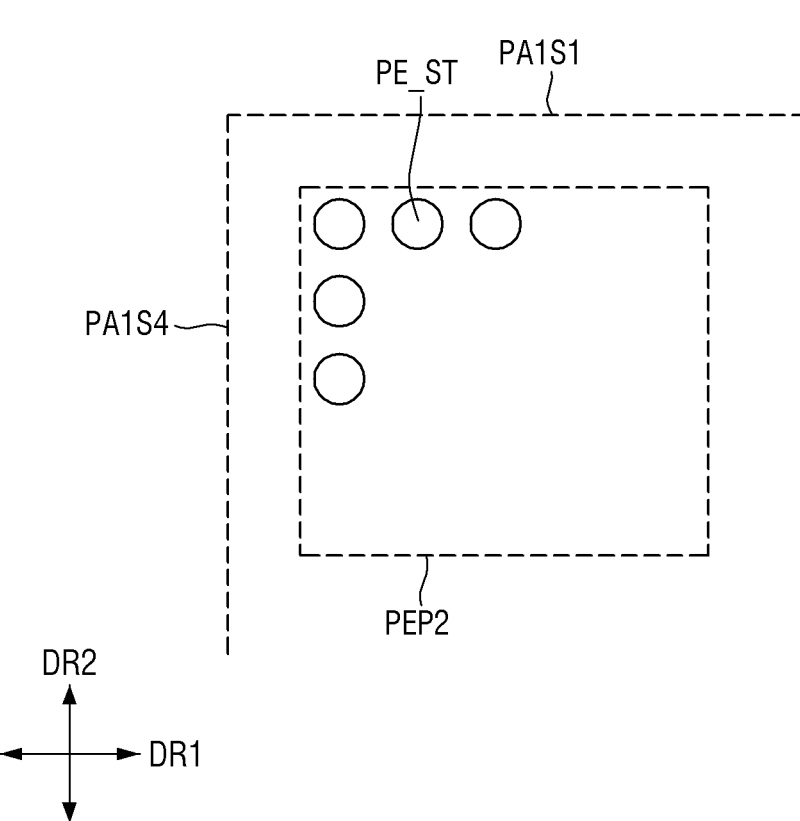
FIG. 8 is a schematic plan view showing a second stud pad area.
Figure 9:
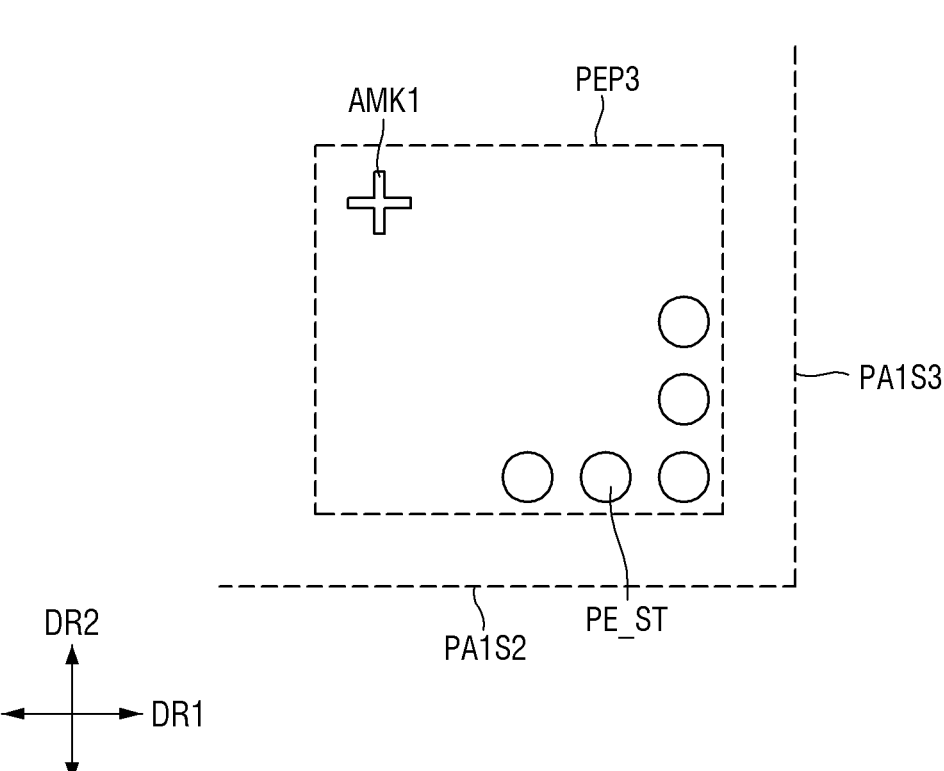
FIG. 9 is a schematic plan view showing a third stud pad area.
Figure 10:
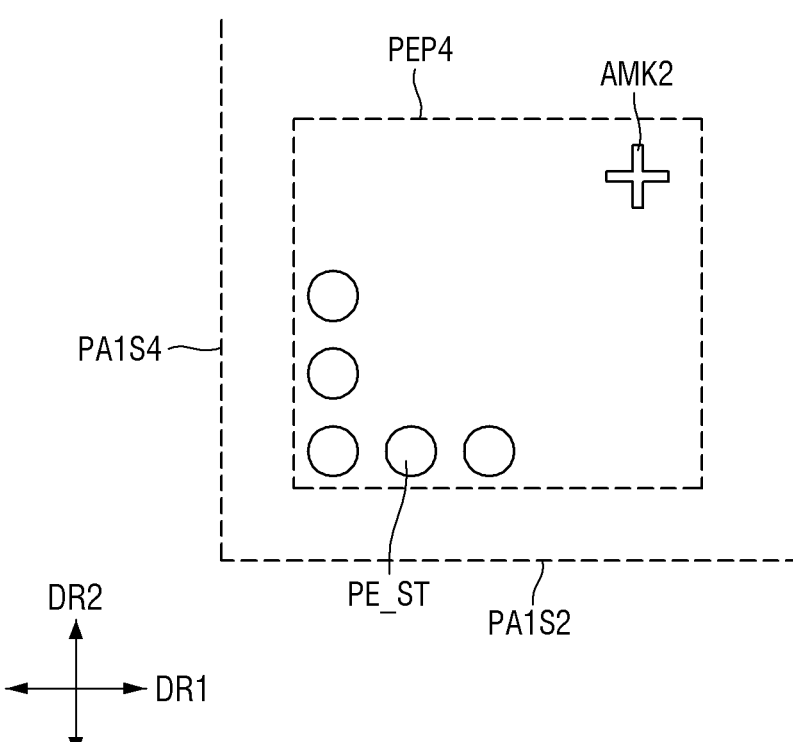
FIG. 10 is a schematic plan view showing a fourth stud pad area.

FIG. 6 is a schematic plan view specifically illustrating the first pad area and the second pad area of the display device of FIG. 1. FIG. 7 is a schematic plan view showing a first stud pad area. FIG. 8 is a schematic plan view showing a second stud pad area. FIG. 9 is a schematic plan view showing a third stud pad area. FIG. 10 is a schematic plan view showing a fourth stud pad area.

Referring to FIG. 6, the first pad area PA1 may include an output pad area PA1_O, which may be adjacent to the display area DA and have output pad electrodes PE1_O disposed therein, an input pad area PA1_I, which may be located under the output pad area PA1_O in plan view and have input pad electrodes PE1_I disposed therein, a stud pad area, which may be disposed at the edge of the first pad area PA1 and have one or more stud pad electrodes disposed therein, and a circuit pad area PA1_C located between the output pad area PA1_O and the input pad area PA1_I.

In the disclosure, the stud may have a meaning of fitting and fixing. For example, as will be described later with reference to FIGS. 18 and 19, it may refer to a method in which a stud bump BP_ST may be in direct contact with a top surface and a side surface of a stud pad pattern PE_ST_P so that the stud bump BP_ST may be fitted and fixed into a stud pad (PE_ST of FIG. 7) in such a way that, between the stud pad patterns PE_ST_P having a symmetrical shape with respect to a direction, the buffer layer 102, the first gate insulating layer 103, and the interlayer insulating layer 104 have a stud hole H-ST penetrating in the thickness direction thereof and the stud bump BP_ST fills the stud hole H-ST. For example, since the stud pad PE_ST may have a structure with the stud hole H-ST, and the stud bump BP_ST may have a structure to be fitted and fixed into the stud pad PE_ST having the stud hole H-ST, the bump and pad having those functions may be respectively referred to as a stud bump and a stud pad in the disclosure.

A method for forming the stud pad PE_ST according to the embodiment may be as follows.

After the buffer layer 102, the first gate insulating layer 103, and the interlayer insulating layer 104 may be entirely deposited on the base substrate 101, a stud pad layer may be formed in the stud pad area (a first stud pad area PEP1 of FIG. 18) on the interlayer insulating layer 104. Thereafter, the stud hole H-ST of FIG. 18 may be formed in the buffer layer 102, the first gate insulating layer 103, the interlayer insulating layer 104, and the stud pad layer.

A method for forming the stud bump BP_ST according to the embodiment may be as follows.

Figure 18:
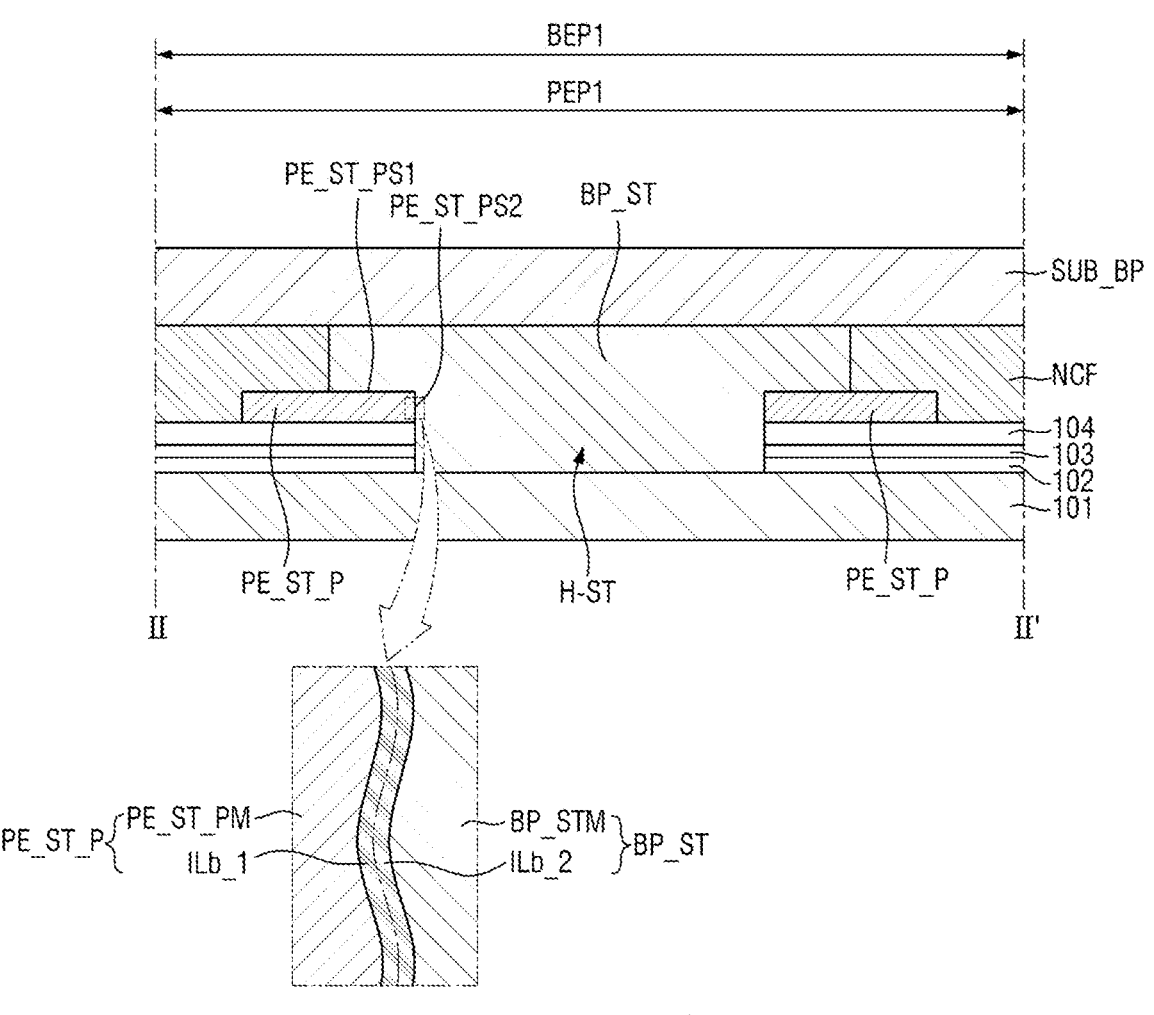
FIG. 18 is a schematic cross-sectional view taken along line II-II' of FIG. 17.
Figure 19:
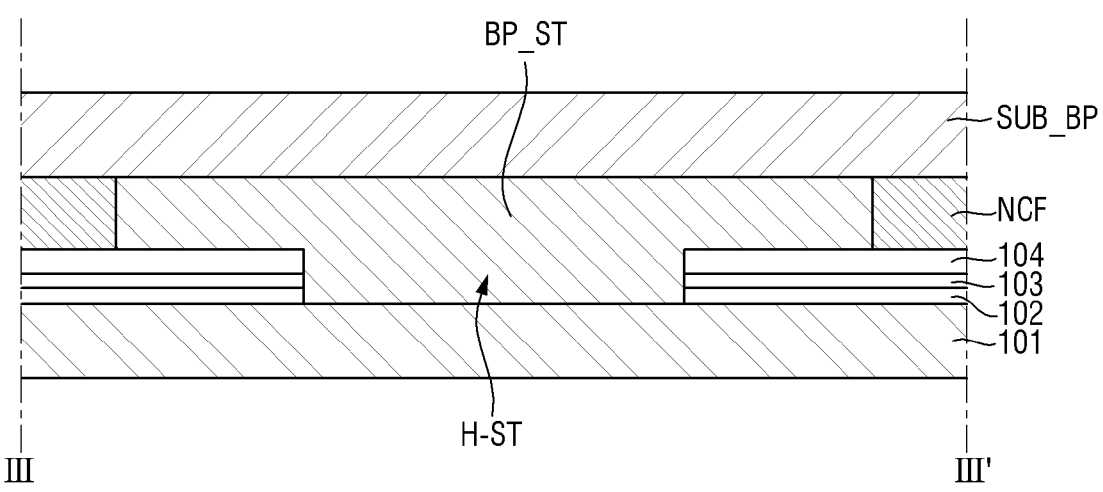
FIG. 19 is a schematic cross-sectional view taken along line of FIG. 17.

After forming a stud bump layer in a stud bump area (first stud bump area BEP1 of FIG. 18) on a circuit base SUB_BP, the stud bump layer may be patterned. The stud bump layer (i.e., the stud bump BP_ST) may be patterned so that the protrusion thereof fills the stud hole H-ST, the protrusion may be in contact with a side surface PE_ST_PS2 of the stud pad pattern PE_ST_P, and the base of the stud bump BP_ST may be in contact with a top surface PE_ST_PS1 of the stud pad pattern PE_ST_P. Although FIGS. 18 and 19 illustrate that three inorganic layers including the buffer layer 102, the first gate insulating layer 103, and the interlayer insulating layer 104 may be disposed between the stud pad pattern PE_ST_P and the base substrate 101, the disclosure is not limited thereto, and two inorganic layers, one inorganic layer, or four or more inorganic layers may be disposed between the stud pad pattern PE_ST_P and the base substrate 101. Referring back to FIG. 6, the output pad electrodes PE1_O may be arranged in the first direction DR1, and the input pad electrodes PE1_I may be arranged in the first direction DR1.

The first pad area PA1 may have a rectangular shape in plan view. The first pad area PA1 may include long sides PA1S1 and PA1S2 extending in the first direction DR1 and short sides PA1S3 and PA1S4 extending in the second direction DR2 in plan view. A corner where the long side of the first pad area PA1 meets the short side of the first pad area PA1 may be angulated.

The stud pad area may be located at a corner portion of the first pad area PA1. The stud pad area may be located between, for example, the short sides PA1S3 and PA1S4 of the first pad area PA1 and the input pad area PA1_I and/or the output pad area PA1_O.

The stud pad area may include a first stud pad area PEP1, a second stud pad area PEP2, a third stud pad area PEP3, and a fourth stud pad area PEP4.

Further referring to FIGS. 7 to 10, the first stud pad area PEP1 may be disposed adjacent to the long side PA1S1 of the first pad area PA1 and the short side PA1S3 of the first pad area PA1, the second stud pad area PEP2 may be disposed adjacent to the long side PA1 S1 of the first pad area PA1 and the short side PA1S4 of the first pad area PA1, the third stud pad area PEP3 may be disposed adjacent to the long side PA1S2 of the first pad area PA1 and the short side PA1S3 of the first pad area PA1, and the fourth stud pad area PEP4 may be disposed adjacent to the long side PA1S2 of the first pad area PA1 and the short side PA1S4 of the first pad area PA1.

The first stud pad area PEP1 may be located between the output pad area PA1_O and the short side PA1S3 of the first pad area PA1, the second stud pad area PEP2 may be located between the output pad area PA1_O and the short side PA1S4 of the first pad area PA1, the third stud pad area PEP3 may be located between the input pad area PA1_I and the short side PA1S3 of the first pad area PA1, and the fourth stud pad area PEP4 may be located between the input pad area PA1_I and the short side PA1S4 of the first pad area PA1.

The display panel (100 of FIG. 1) may further include one or more resistance measurement pads located in the output pad area PA1_O of the first pad area PA1, one or more resistance test point pads located in the second pad area PA2, and a resistance measurement line connected to the resistance measurement pad and the resistance test point pad.

The one or more resistance measurement pads may include a first resistance measurement pad PE1_R1, a second resistance measurement pad PE1_R2, and a third resistance measurement pad PE1_R3. The one or more resistance test point pads may include a first resistance test point pad TP1, a second resistance test point pad TP2, a third resistance test point pad TP3, and a fourth resistance test point pad TP4. A resistance measurement line PE1_L1 may connect the first resistance measurement pad PE1_R1 to the first resistance test point pad TP1, the resistance measurement line PE1_L2 may connect the second resistance measurement pad PE1_R2 to the second resistance test point pad TP2, the resistance measurement line PE1_L3 may connect the second resistance measurement pad PE1_R2 to the third resistance test point pad TP3, and the resistance measurement line PE1_L4 may connect the third resistance measurement pad PE1_R3 to the fourth resistance test point pad TP4.

As shown in FIG. 6, the resistance measurement pads PE1_R1, PE1_R2, and PE1_R3 may be located adjacent to the short side PA1S3 of the first pad area PA1, and the resistance test point pads TP1, TP2, TP3 and TP4 may be located adjacent to the edge of the second pad area PA2. For example, the resistance measurement pads PE1_R1, PE1_R2, and PE1_R3 may be located on a side of the array of the output pad electrodes PE1_O in the first direction DR1, and the resistance test point pads TP1, TP2, TP3, and TP4 may be located on a side of the array of the second pad electrodes PE2 in the first direction DR1.

As shown in FIG. 7, stud pad electrodes PE_ST located in the first stud pad area PEP1 may be arranged adjacent to a long side PA1 S1 of the first pad area PA1 in the second direction DR2, and a short side PA1S3 of the first pad area PA1 in the first direction DR1. The stud pad electrodes PE_ST may be arranged in the extension directions of the long side PA1S1 of the first pad area PA1 in the second direction DR2, and the short side PA1S3 of the first pad area PA1 in the first direction DR1.

As shown in FIG. 8, stud pad electrodes PE_ST located in the second stud pad area PEP2 may be arranged adjacent to the long side PA1S1 of the first pad area PA1 in the second direction DR2, and the other short side PA1S4 of the first pad area PA1 in the first direction DR1. The stud pad electrodes PE_ST may be arranged in the extension directions of the long side PA1S1 of the first pad area PA1 in the second direction DR2, and the other short side PA1S4 of the first pad area PA1 in the first direction DR1.

As shown in FIG. 9, stud pad electrodes PE_ST located in the third stud pad area PEP3 may be arranged adjacent to the other long side PA1S2 of the first pad area PA1 in the second direction DR2, and the short side PA1S3 of the first pad area PA1 in the first direction DR1. The stud pad electrodes PE_ST may be arranged in the extension directions of the other long side PA1S2 of the first pad area PA1 in the second direction DR2, and the short side PA1S3 of the first pad area PA1 in the first direction DR1. As shown in FIG. 9, a first alignment mark AMK1 may be further disposed in the third stud pad area PEP3. The first alignment mark AMK1 may serve to align the driving integrated circuit D_IC on the first pad area PA1 in case that the driving integrated circuit D_IC is attached to the first pad area PA1, together with a second alignment mark AMK2 which will be described next.

As shown in FIG. 10, stud pad electrodes PE_ST located in the fourth stud pad area PEP4 may be arranged adjacent to the other long side PA1S2 of the first pad area PA1 in the second direction DR2, and the other short side PA1S4 of the first pad area PA1 in the first direction DR1. The stud pad electrodes PE_ST may be arranged in the extension directions of the other long side PA1S2 of the first pad area PA1 in the second direction DR2, and the other short side PA1S4 of the first pad area PA1 in the first direction DR1. The above-described second alignment mark AMK2 may be further disposed in the fourth stud pad area PEP4.

The input pad electrode PE1_I, the output pad electrode PE1_O, and the stud pad electrode described above may be located on a same layer. The stud pad electrode may include stud pad patterns.

Figure 11:
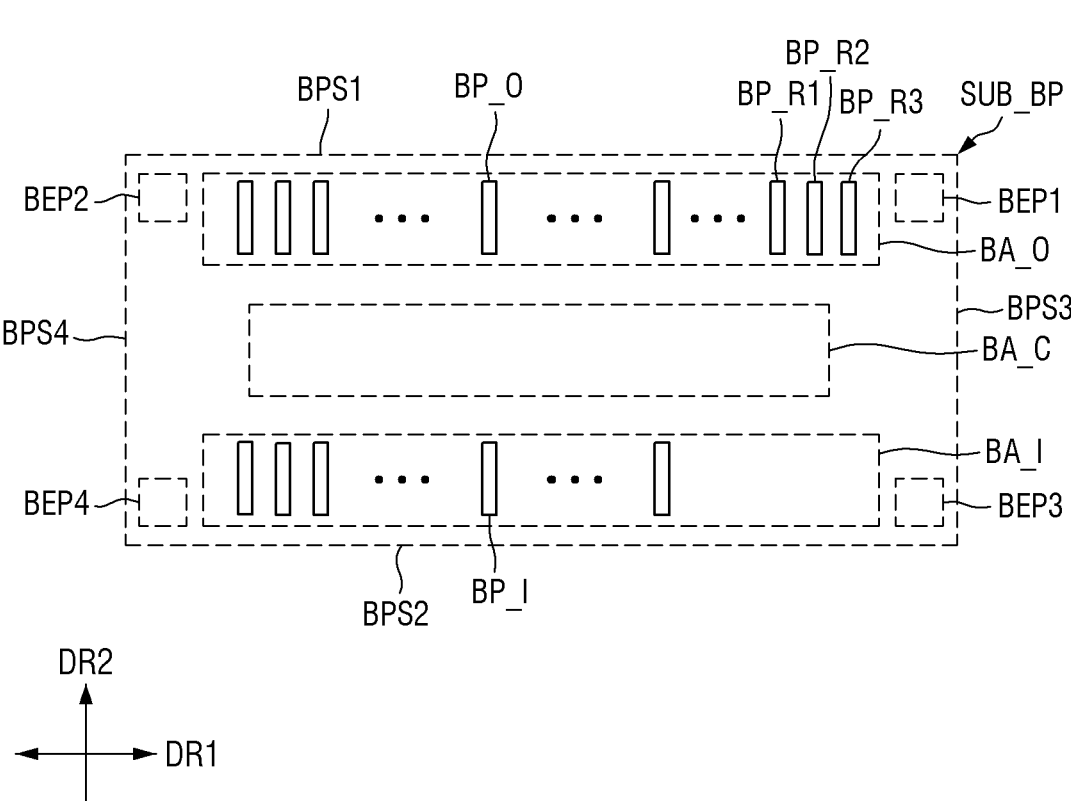
FIG. 11 is a schematic plan view illustrating a driving integrated circuit according to an embodiment.
Figure 12:
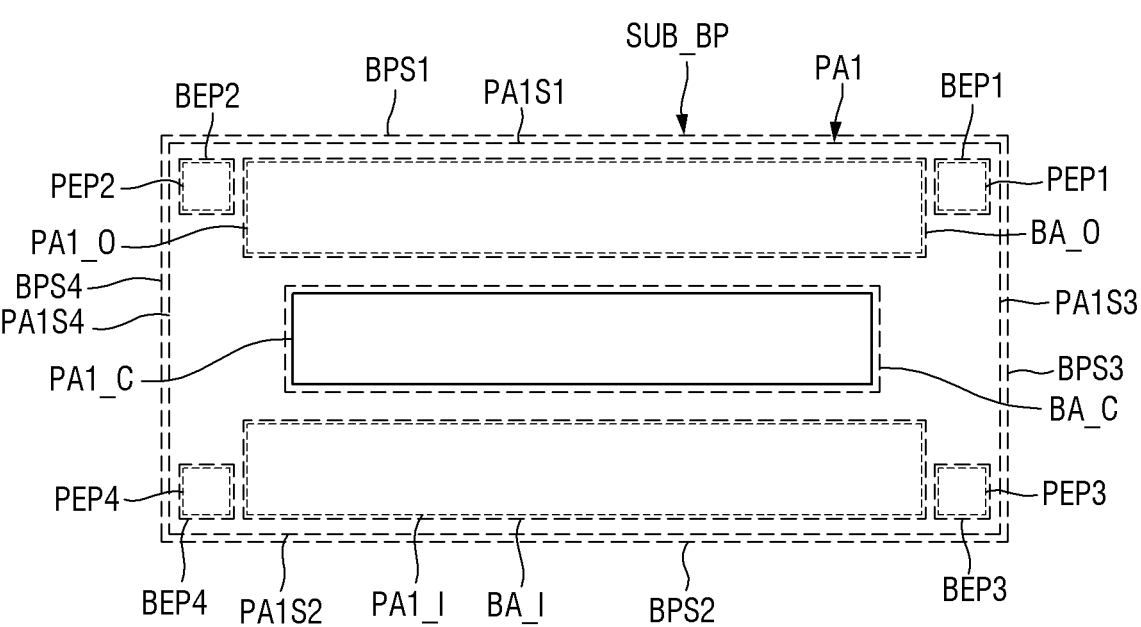
FIG. 12 is a schematic plan view showing a state in which the driving integrated circuit of FIG. 11 is attached to the first pad area of FIG. 6.
Figure 12:
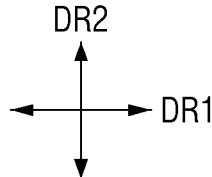

FIG. 11 is a schematic plan view illustrating a driving integrated circuit according to an embodiment. FIG. 12 is a schematic plan view showing a state in which the driving integrated circuit of FIG. 11 is attached to the first pad area of FIG. 6.

Referring to FIGS. 11 and 12, the driving integrated circuit (D_IC of FIG. 1) may include a circuit base SUB_BP and bumps disposed on the circuit base SUB_BP. The driving integrated circuit D_IC may include an output bump area BA 0, which overlaps the output pad area PA1_O and has output bumps BP_O disposed therein, an input bump area BA_I, which overlaps the input pad area PA1_I and has input bumps BP_I disposed therein, a circuit bump area BA_C located between the output bump area BA_O and the input bump area BA_I, and stud bump areas disposed to overlap the stud pad areas. The arrangement of the output bump area BA_O, the input bump area BA_I, the circuit bump area BA_C, and the stud bump areas may be similar to the arrangement of the output pad area PA1_O, the input pad area PA1_I, the circuit pad area PA1_C, and the stud pad areas of the first pad area PA1 of the display panel 100.

Multiple stud bump areas BEP1, BEP2, BEP3, and BEP4 may be provided. Further, the driving integrated circuit D_IC may have a shape with four corners formed by long sides BPS1 and BPS2 and short sides BPS3 and BPS4 in plan view, and the stud bump areas BEP1, BEP2, BEP3, and BEP4 may be located adjacent to the respective four corners.

The stud bump areas BEP1, BEP2, BEP3, and BEP4 may be located outside the output bump area BA_O and the input bump area BA_I in plan view.

The driving integrated circuit D_IC may include one or more resistance measurement bumps located in the output bump area BP_O. The one or more resistance measurement bumps may include a first resistance measurement bump BP_R1, a second resistance measurement bump BP_R2, and a third resistance measurement bump BP_R3. The resistance measurement bumps BP_R1, BP_R2, and BP_R3 may be connected to the resistance measurement pads PE1_R1, PE1_R2, and PE1_R3, respectively.

Figure 13:
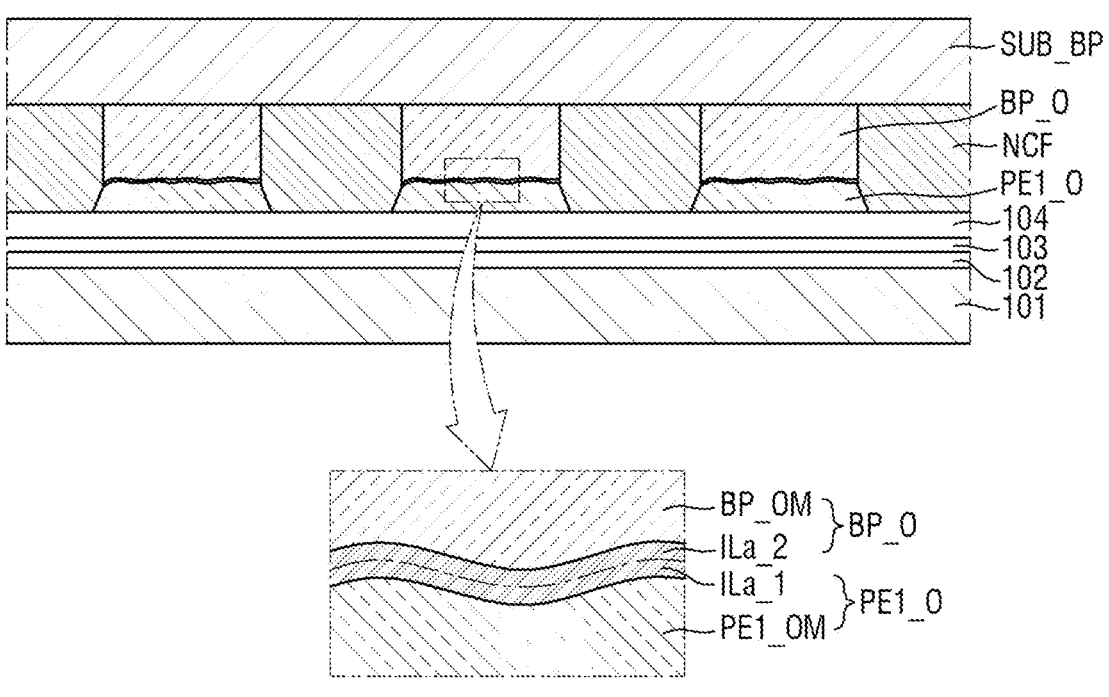
FIG. 13 is a schematic cross-sectional view of FIG. 12.

FIG. 13 is a schematic cross-sectional view of FIG. 12.

Figure 14:
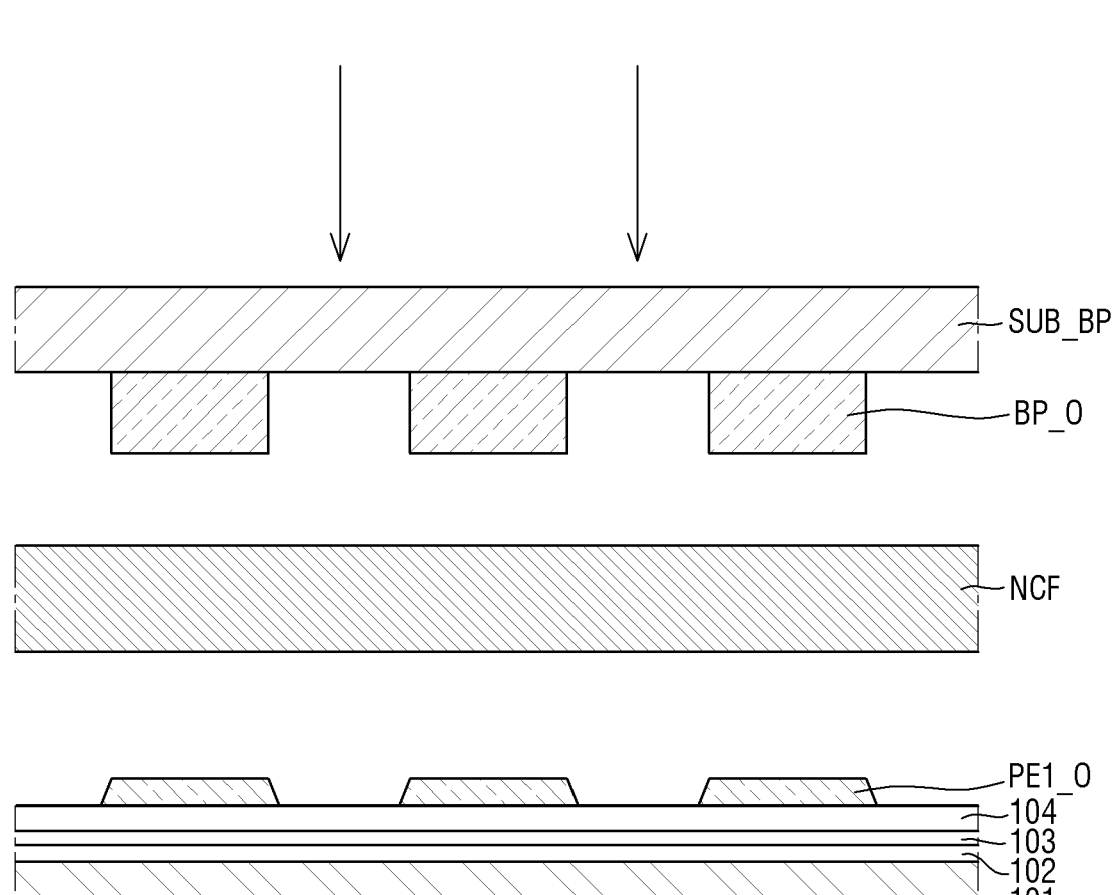
FIG. 14 is a schematic diagram illustrating attachment between a first pad area and a driving integrated circuit according to an embodiment.

FIG. 14 is a schematic diagram illustrating attachment between a first pad area and a driving integrated circuit according to an embodiment.

Referring to FIGS. 13 and 14 in conjunction with FIG. 5, the output pad electrode PE1_O may be bonded (e.g., directly bonded) to the output bump BP_O. Although FIG. 13 illustrates only that the output pad electrode PE1_O may be directly bonded to the output bump BP_O, the disclosure is not limited thereto. The input pad electrode PE1_I may be directly bonded to the input bump BP_I, and the resistance measurement bumps BP_R1, BP_R2, and BP_R3 may be directly bonded to the resistance measurement pads PE1_R1, PE1_R2, and PE1_R3, respectively.

The output pad electrode PE1_O may be ultrasonically bonded to the output bump BP_O. For example, as shown in the enlarged view of FIG. 13, an intermediate layer ILa may be further disposed between an area PE1_OM made only of a material of the output pad electrode PE1_O and an area BP_OM made only of a material of the output bump BP_O. The intermediate layer ILa may be an area in which material of the output pad electrode PE1_O may be mixed with material of the output bump BP_O.

As shown in FIG. 13, the output pad electrode PE1_O may include the area PE1_OM made only of material of the output pad electrode PE1_O and a lower area of the intermediate layer ILa, and the output bump BP_O may include the area BP_OM made only of material of the output bump BP_O and an upper area of the intermediate layer ILa. A lower area ILa_1 and an upper area ILa_2 of the intermediate layer ILa may be areas in which material of the output bump BP_O may be mixed with material of the output pad electrode PE1_O, and may have the same constituent material. However, they may be introduced for simplicity of description to clarify the boundary between the output bump BP_O and the output pad electrode PE1_O. Therefore, for simplicity of description, an upper portion may be defined as the upper area ILa_2 of the intermediate layer ILa, and a lower portion may be defined as the lower area ILa_1 of the intermediate layer ILa, with respect to a boundary line that divides the intermediate layer ILa into equal portions in the thickness direction.

A non-conductive adhesive member NCF may be further disposed between the adjacent output bumps BP_O and between the adjacent output pad electrodes PE1_O. The non-conductive adhesive member NCF may be in direct contact with the side surface of the output bump BP_O and output pad electrode PE1_O that may be ultrasonically bonded.

As shown in FIG. 14, the non-conductive adhesive member NCF may be disposed on the output pad electrodes PE1_O, and the circuit base SUB_BP, in which the output bumps BP_O may be provided, may be disposed on the non-conductive adhesive member NCF. In case that a thermal pressure is applied to the circuit base SUB_BP downwardly while applying vibration energy by a bonding device, the non-conductive adhesive member NCF may be partially and/or entirely melted and may flow from the overlapping portion of the output bump BP_O and the output pad electrode PE1_O to the periphery thereof. The output bump BP_O and the output pad electrode PE1_O may be bonded (e.g., directly bonded) to each other by frictional heat at the interface thereof, and the non-conductive adhesive member NCF may be attached to the side surface of the bonded output bump BP_O and output pad electrode PE1_O.

Figure 15:
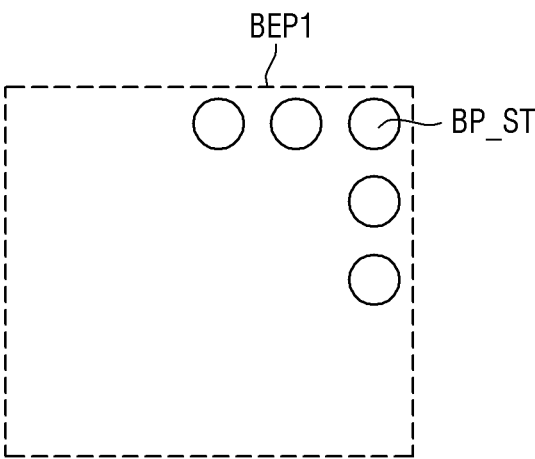
FIG. 15 is a schematic plan view showing a first stud bump area.

FIG. 15 is a schematic plan view showing a first stud bump area.

Referring to FIG. 15, the first stud bump area BEP1 may have a shape similar to the shape of the first stud pad area PEP1 in plan view. Stud bumps BP_ST may be disposed in the first stud bump area BEP1.

A material of the stud bump BP_ST may be the same as or different from a material of the output bump BP_O. For example, unlike the output bump BP_O, the stud bump BP_ST may not be for electrical connection with the stud pad PE_ST. Thus, various metals may be used for the stud bump BP_ST except the material of the output bump BP_O such as gold (Au) having good electrical conductivity. For example, the stud bump BP_ST may include copper (Cu) or tungsten (W), but is not limited thereto.

Figure 16:
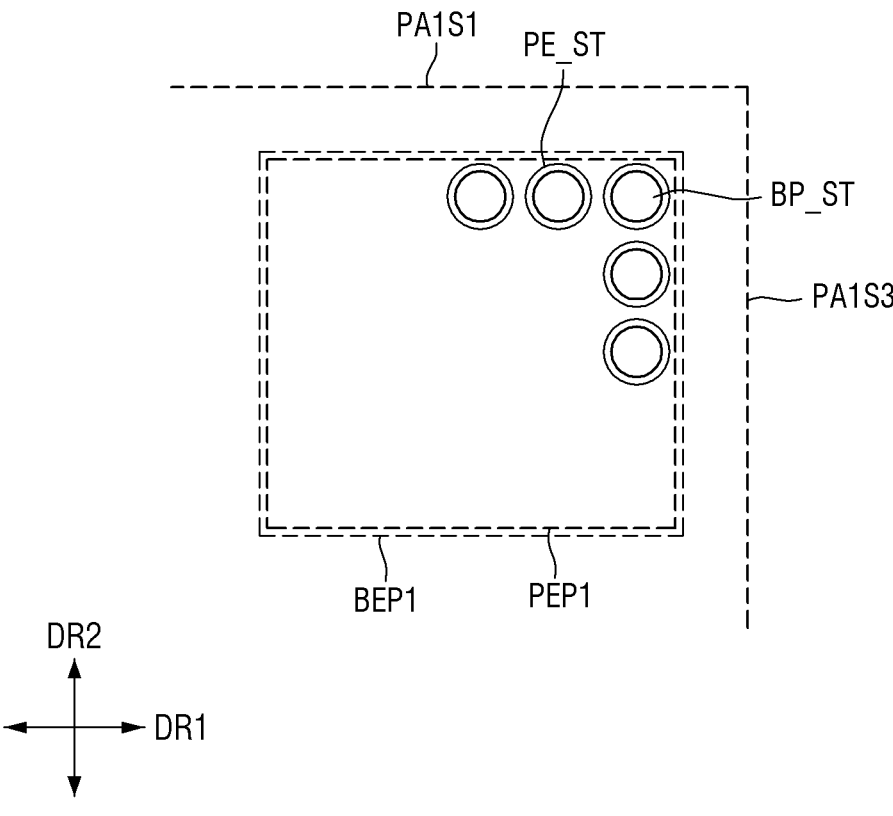
FIG. 16 is a schematic plan view illustrating that the first stud bump area of FIG. 15 may be attached to the first stud pad area of FIG. 7.
Figure 17:
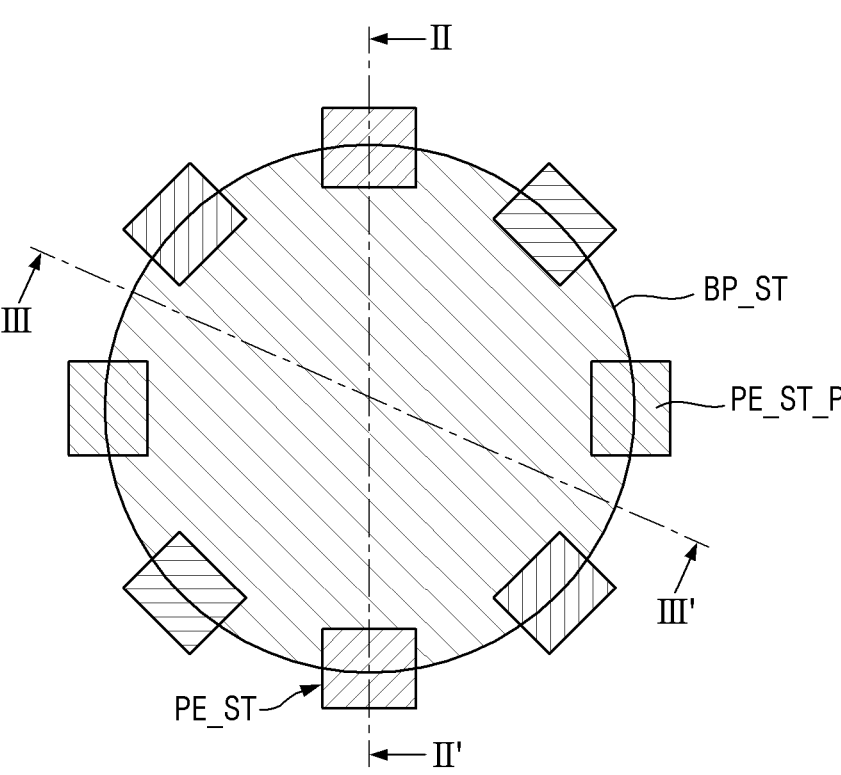
FIG. 17 is an enlarged schematic view of the stud pad and the stud bump of FIG. 16.

FIG. 16 is a schematic plan view illustrating that the first stud bump area of FIG. 15 may be attached to the first stud pad area of FIG. 7. FIG. 17 is an enlarged schematic view of the stud pad and the stud bump of FIG. 16. FIG. 18 is a schematic cross-sectional view taken along line II-IP of FIG. 17. FIG. 19 is a schematic cross-sectional view taken along line III-III' of FIG. 17. FIG. 18 illustrates only cross-sectional structures of the first stud pad area PEP1 and the first stud bump area BEP1, but cross-sectional structures of the stud pad areas PEP2, PEP3, and PEP4 and the stud bump areas BEP2, BEP3 and BEP4, which are not shown, may be the same as the cross-sectional structures of FIG. 18.

Referring to FIGS. 16 to 19, the stud pad electrode PE_ST may be disposed to overlap an edge portion of the stud bump BP_ST.

The stud pad electrodes PE_ST may include stud pad patterns PE_ST_P, which may be separated from each other with a separation space therebetween in plan view. The stud pad patterns PE_ST_P may be disposed to overlap the edge portion of the stud bump BP_ST. The stud pad patterns PE_ST_P may not be disposed to overlap a center portion of the stud bump BP_ST.

The stud pad pattern PE_ST_P may include a part overlapping the stud bump BP_ST and a part not overlapping the stud bump BP_ST.

The stud pad patterns PE_ST_P may be arranged in a closed loop shape in plan view. Further, the stud pad patterns PE_ST_P may have a symmetrical shape with respect to a direction in plan view.

As shown in FIGS. 18 and 19, between the stud pad patterns PE_ST_P having the symmetrical shape with respect to the direction, the buffer layer 102, the first gate insulating layer 103, and the interlayer insulating layer 104 may include the stud hole H-ST penetrating in the thickness direction. In some embodiments, the buffer layer 102 may extend as a body without including the stud hole H-ST. For example, the first gate insulating layer 103 and the interlayer insulating layer 104 may include the stud hole H-ST penetrating in the thickness direction, but the buffer layer 102 may not include the stud hole H-ST.

In some other embodiments, the buffer layer 102 and the first gate insulating layer 103 may extend as a body without including the stud hole H-ST.

FIG. 18 illustrates the case in which three insulating layers 102, 103, and 104 may be disposed between the stud pad pattern PE_ST_P and the base substrate 101, but the disclosure is not limited thereto. Two or four or more insulating layers may be disposed between the base substrate 101 and the stud pad pattern PE_ST_P.

The side surfaces of the buffer layer 102, the first gate insulating layer 103, and the interlayer insulating layer 104 may be exposed through the stud hole H-ST.

As shown in FIG. 18, the stud bump BP_ST may fill the stud hole H-ST to be in direct contact with the stud pad pattern PE_ST_P. The stud bump BP_ST may be in direct contact with the top surface and side surface of the stud pad pattern PE_ST_P. The stud bump BP_ST and the stud pad pattern PE_ST_P that may be in direct contact with each other may be ultrasonically bonded to each other.

For example, as shown in the enlarged view of FIG. 18, an intermediate layer ILb may be further disposed between an area PE_ST PM made only of the material of the stud pad pattern PE_STP and an area BP_STM made only of the material of the stud bump BP_ST. The intermediate layer ILb may be an area in which the material of the stud pad pattern PE_ST_P may be mixed with the material of the stud bump BP_ST.

As shown in FIG. 18, the stud pad pattern PE_ST_P may include the area PE_ST PM made only of the material of the stud pad pattern PE_ST_P and an area ILb_1 of the intermediate layer ILb, and the stud bump BP_ST may include the area BP_STM made only of the material of the stud bump BP_ST and the other area ILb_2 of the intermediate layer ILb. The area ILb_1 and the other area ILb_2 of the intermediate layer ILb may be areas in which the material of the stud pad pattern PE_ST_P may be mixed with the material of the stud bump BP_ST, and have the same constituent material. However, they may be introduced for simplification of description to clarify the boundary between the stud pad pattern PE_ST_P and the stud bump BP_ST. Therefore, for simplicity of description, a portion may be defined as the area ILb_1 of the intermediate layer ILb, and the other portion may be defined as the other area ILb_2 of the intermediate layer ILb with respect to a boundary line that divides the intermediate layer ILb into equal portions in a horizontal direction.

As shown in FIG. 19, the stud bump BP_ST may be in direct contact with the side surfaces of the buffer layer 102, the first gate insulating layer 103, and the interlayer insulating layer 104 through the exposed stud hole H-ST.

Referring to FIGS. 2A, 2B, 3, 6, and 13, as described above, the second lower film PF2 may not be disposed in a region of the sub-area SA, which overlaps the driving integrated circuit D_IC in the thickness direction, and thus the non-conductive adhesive member NCF disposed in each of the output pad area PA1_O and the input pad area PA1_I may readily float because a supporting film may not be disposed thereunder. In particular, since bumps may not be disposed at the edge of the driving integrated circuit D_IC and pad electrodes may not be disposed at the edge of the first pad area PA1, the non-conductive adhesive member NCF may float severely at the corresponding edges.

Floating of the non-conductive adhesive member NCF may cause cracks in wires disposed adjacent to the area where the floating occurs.

Particularly, as described above with reference to FIG. 6, the resistance measurement pads PE1_R1, PE1_R2, and PE1_R3 may be located adjacent to the short side PA1S3 of the first pad area PA1, and the resistance test point pads TP1, TP2, TP3, and TP4 may be located adjacent to the edge of the second pad area PA2. For example, since the resistance measurement pads PE1_R1, PE1_R2, and PE1_R3 may be located on a side of the array of the output pad electrodes PE1_O in the first direction DR1, and the resistance test point pads TP1, TP2, TP3, and TP4 may be located on a side of the array of the pad electrodes PE2 in the first direction DR1, the resistance measurement lines PE1_L1, PE1_L2, and PE1_L3, which connect them to each other, may be disconnected because they may also be located at the edge.

However, in accordance with the display device according to an embodiment, the stud bumps BP_ST and the stud pad electrodes PE_ST may be respectively disposed at the edge of the driving integrated circuit D_IC and the edge of the first pad area PA1, and the stud bumps BP_ST may be ultrasonically bonded to the stud pad electrodes PE_ST, thereby minimizing floating of the non-conductive adhesive member NCF at the corresponding edges.

Further, the display device according to an embodiment includes the stud pad PE_ST having the stud pad pattern PE_ST_P, and thus there may also be an advantage (providing a passage of the non-conductive adhesive member NCF between the stud pad patterns PE_ST_P) in which the non-conductive adhesive member NCF described above with reference to FIGS. 13 and 14 may more readily flow.

Hereinafter, other embodiments will be described.

Figure 20:
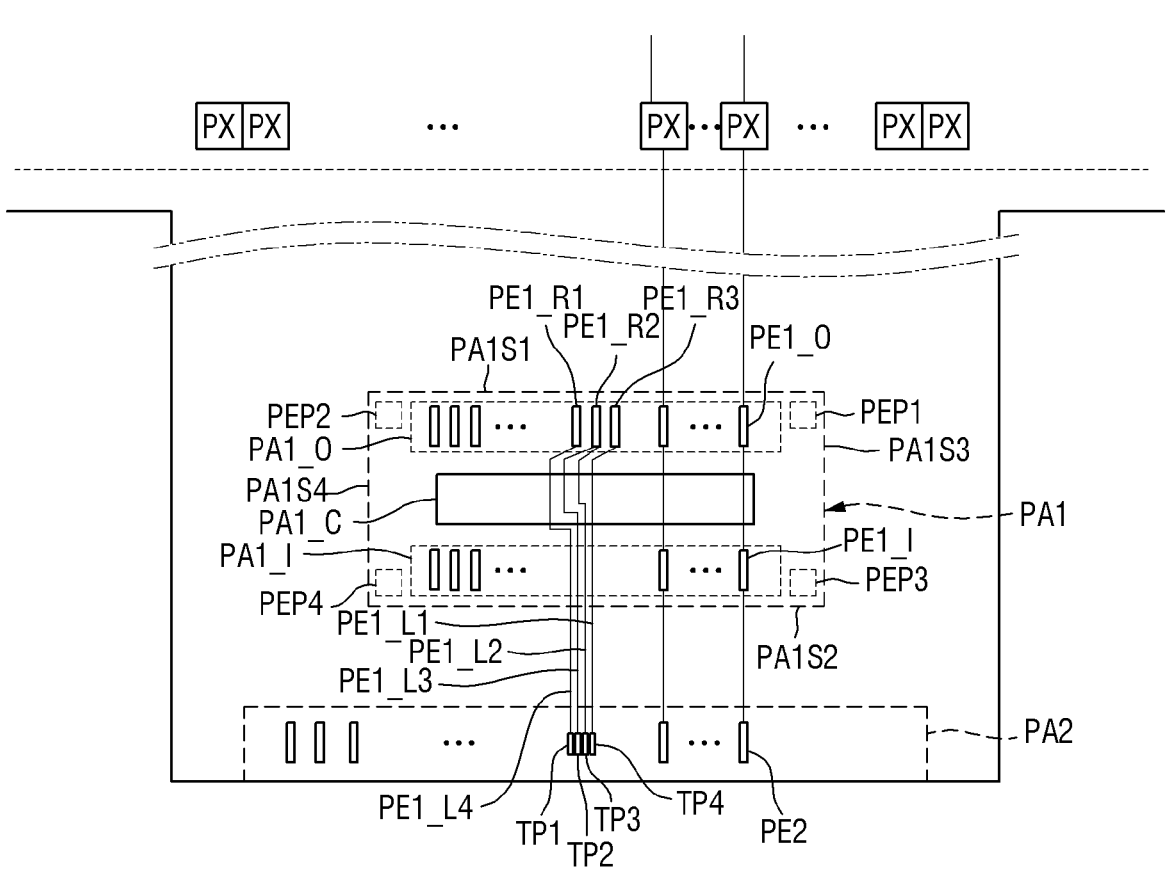
FIG. 20 is a schematic plan view specifically illustrating the first pad area and the second pad area of the display device of FIG. 1, according to still another embodiment.
Figure 20:
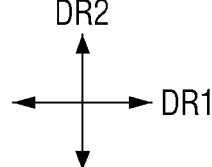

FIG. 20 is a schematic plan view specifically illustrating the first pad area and the second pad area of the display device of FIG. 1, according to still another embodiment.

Referring to FIG. 20, an embodiment may be different from the display device of FIG. 6 at least in that the resistance measurement pads PE1_R1, PE1_R2 and PE1_R3, and the resistance test point pads TP1, TP2, TP3 and TP4 may be located at the center of the first pad area PA1 and the center of the second pad area PA 2, respectively.

Specifically, the resistance measurement pads PE1_R1, PE1_R2 and PE1_R3 may be located between the output pad electrodes PE1_O, and the resistance test point pads TP1, TP2, TP3, and TP4 may be located between the second pad electrodes PE2.

Also in the embodiment, the stud bumps BP_ST and the stud pad electrodes PE_ST may be respectively disposed at the edge of the driving integrated circuit D_IC and the edge of the first pad area PA1, and the stud bumps BP_ST may be ultrasonically bonded to the stud pad electrodes PE_ST, thereby minimizing floating of the non-conductive adhesive member NCF at the corresponding edges.

Further, since the resistance measurement pads PE1_R1, PE1_R2 and PE1_R3 may be located between the output pad electrodes PE1_O, and the resistance test point pads TP1, TP2, TP3 and TP4 may be located between the second pad electrodes PE2, the resistance measurement lines PE1_L1, PE1_L2, and PE1_L3, which connect them to each other, may also be located at the center, not at the edge. Therefore, it may be possible to minimize disconnection of the resistance measurement lines PE1_L1, PE1_L2, and PE1_L3.

Figure 21:
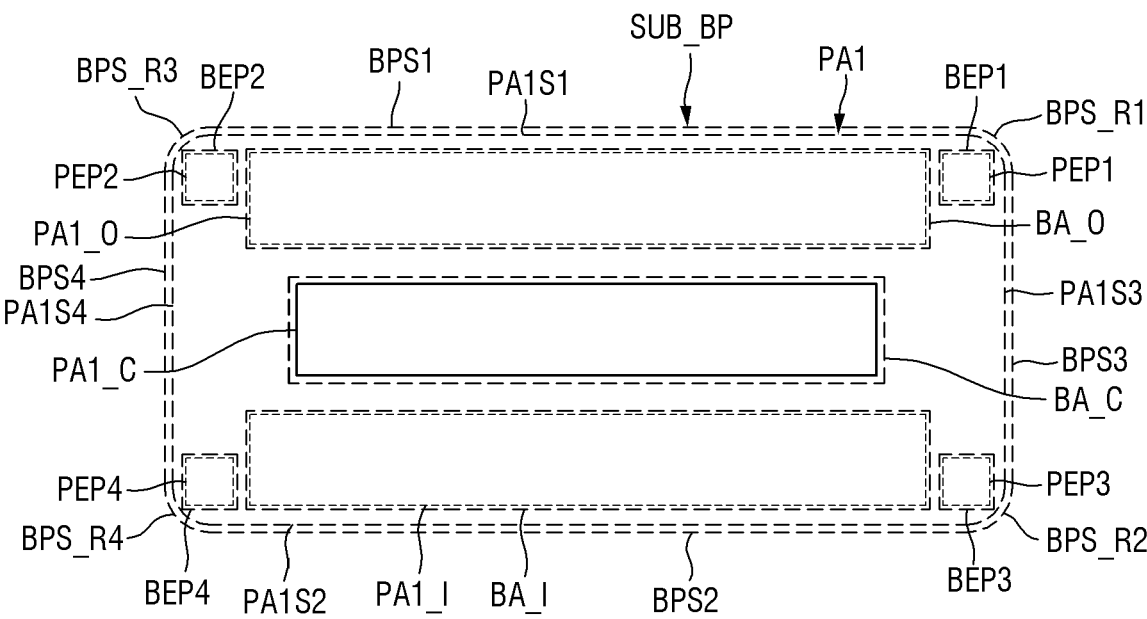
FIG. 21 is a schematic plan view illustrating a state in which a driving integrated circuit is attached to a first pad area, according to still another embodiment.
Figure 21:
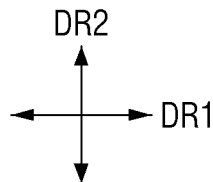

FIG. 21 is a schematic plan view illustrating a state in which a driving integrated circuit is attached to a first pad area, according to still another embodiment.

Referring to FIG. 21, an embodiment may be different from the driving integrated circuit having angled edges according to FIG. 12 at least in that a driving integrated circuit according to an embodiment may have a shape further including edge portions between the long sides PA1 S1 and PA1S2 and the short sides PA1S3 and PA1S4 in plan view.

Specifically, the driving integrated circuit according to the embodiment may have a shape further including the edge portions between the long sides PA1S1 and PA1S2 and the short sides PA1S3 and PA1 S4 in plan view. The edge portions may include curved portions BPS_R1, BPS_R2, BPS_R3, and BPS_R4 having a curved shape.

According to an embodiment, since the edge portions may include the curved portions BPS_R1, BPS_R2, BPS_R3, and BPS_R4 (polished edges) having a curved shape, it may be possible to prevent cracks occurring on the display panel due to the edges of the driving integrated circuit during ultrasonic bonding.

Figure 22:
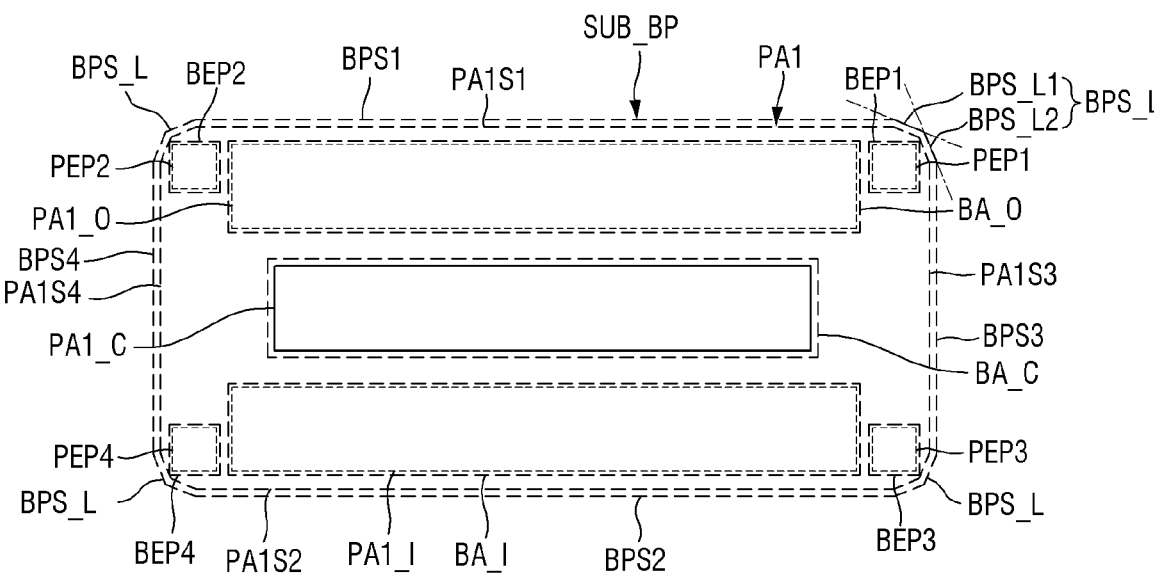
FIG. 22 is a schematic plan view illustrating a state in which a driving integrated circuit is attached to a first pad area, according to still another embodiment.
Figure 22:
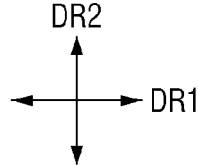

FIG. 22 is a schematic plan view illustrating a state in which a driving integrated circuit is attached to a first pad area, according to still another embodiment.

Referring to FIG. 22, an embodiment may be different from the driving integrated circuit according to FIG. 21 at least in that an edge portion of a driving integrated circuit according to an embodiment may include at least two sides in different extension directions.

Specifically, for example, an edge portion BPS L may include two sides BPS_L1 and BPS_L2 in different extension directions. The extension directions of the two sides BPS_L1 and BPS_L2 may be different from the first direction DR1, which may be the extension direction of the long sides BPS1 and BPS2 of the driving integrated circuit, and the second direction DR2, which may be the extension direction of the short sides BPS3 and BPS4 thereof.

Figure 23:
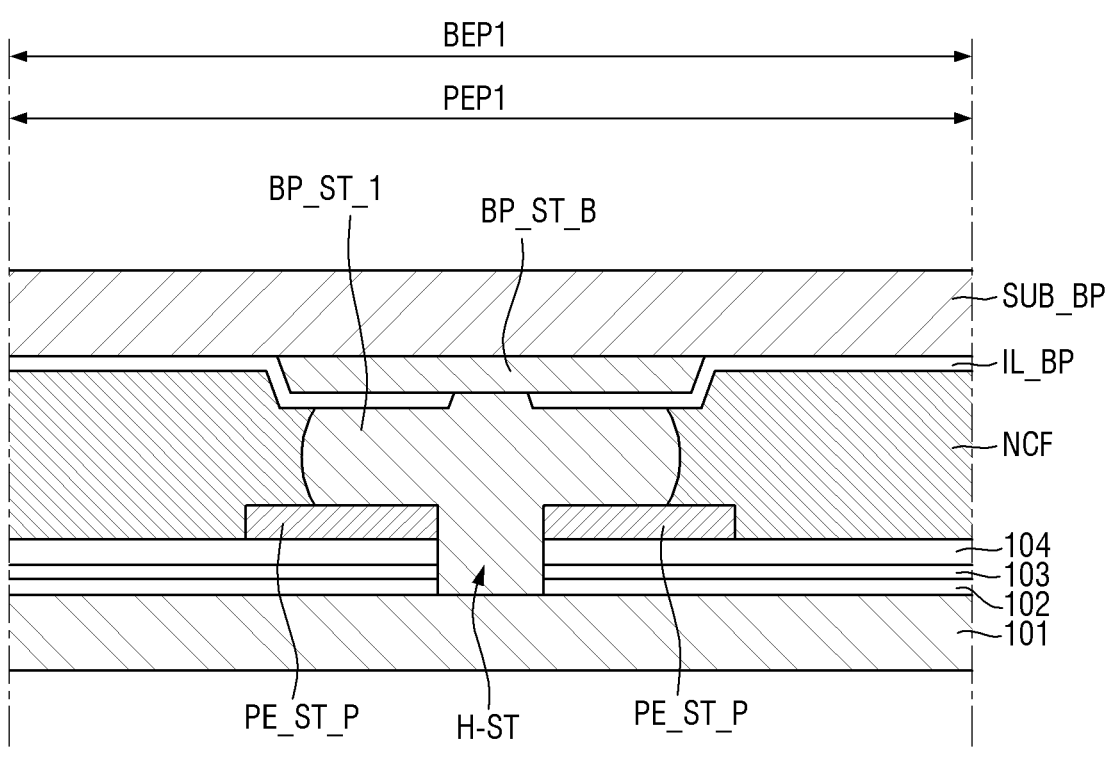
FIG. 23 is a schematic cross-sectional view illustrating a stud pad pattern and a stud bump of a display device according to still another embodiment.

FIG. 23 is a schematic cross-sectional view illustrating a stud pad pattern and a stud bump of a display device according to still another embodiment.

Referring to FIG. 23, an embodiment may be different from the embodiment according to FIG. 18 at least in that the stud bump according to an embodiment may include an upper stud bump BP_ST_1 in contact with the stud pad pattern PE_ST_P and a lower stud bump BP_ST_B on the circuit base SUB_BP.

Specifically, the lower stud bump BP_ST_B may be disposed on the circuit base SUB_BP. A bump insulating layer IL_BP may be disposed on the lower stud bump BP_ST_B. The bump insulating layer IL_BP may cover most of the lower stud bump BP_ST_B while exposing the center of the lower stud bump BP_ST_B. The upper stud bump BP_ST_1 may be in contact with the exposed center of the lower stud bump BP_ST_B. FIG. 23 illustrates that the upper stud bump BP_ST_1 has a cross-sectional shape in which both sides thereof may be convex outwardly. However, the disclosure is not limited thereto, and embodiments may have the same cross-sectional shape as that shown in FIG. 18.

Although embodiments of the disclosure have been disclosed for illustrative purposes, those skilled in the art will appreciate that various modifications, additions and substitutions are possible, without departing from the scope and spirit of the disclosure as disclosed in the accompanying claims, including equivalents thereof.

What is claimed is:

1. A display device comprising:
a display panel including:
a display area including pixels; and
a pad area adjacent to the display area; and
a driving integrated circuit mounted on the pad area, wherein
the pad area includes a stud pad area located at an edge of the pad area and including at least one stud pad electrode,
the driving integrated circuit includes:
a circuit base; and
at least one stud bump area overlapping the stud pad area in a thickness direction of the display device and including at least one stud bump,
the at least one stud pad electrode overlaps an edge portion of the at least one stud bump in plan view and the stud bump extends through an entire thickness of the stud pad electrode at a center thereof, wherein
the at least one stud pad electrode includes stud pad patterns separated from each other with a separation space between the stud pad patterns in a plan view.

2. The display device of claim 1, wherein the pad area further includes:
an output pad area adjacent to the display area and including output pad electrodes; and
an input pad area located below the output pad area in a plan view and including input pad electrodes.

3. The display device of claim 1, wherein the stud pad patterns do not overlap a center portion of the at least one stud bump in the thickness direction.

4. The display device of claim 1, wherein at least one stud pad pattern includes a portion that does not overlap the at least one stud bump in the thickness direction.

5. A display device comprising:
a display panel including:
a display area including pixels; and
a pad area adjacent to the display area; and
a driving integrated circuit mounted on the pad area, wherein
the pad area includes a stud pad area located at an edge of the pad area and including at least one stud pad electrode,
the driving integrated circuit includes:
a circuit base; and
at least one stud bump area overlapping the stud pad area in a thickness direction of the display device and including at least one stud bump,
the at least one stud pad electrode overlaps an edge portion of the at least one stud bump in plan view, wherein
the at least one stud pad electrode includes stud pad patterns separated from each other with a separation space between the stud pad patterns in a plan view, and
the stud pad patterns overlap the edge portion of the at least one stud bump in the thickness direction and include portions that protrude outward from the edge portion of the at least one stud bump in the plan view, and
wherein the stud pad patterns are disposed in a closed loop shape in a plan view.

6. The display device of claim 5, wherein the stud pad patterns are symmetrical with respect to a direction in a plan view.

7. The display device of claim 6, wherein the display panel further includes:
a base substrate; and
at least one inorganic layer on the base substrate, the at least one inorganic layer includes a stud hole penetrating in the thickness direction between the stud pad patterns symmetrical with respect to the direction, wherein a side surface of the at least one inorganic layer is exposed through the stud hole.

8. The display device of claim 7, wherein
the at least one stud bump fills and is disposed in the stud hole, and
the at least one stud bump directly contacts at least one of the stud pad patterns.

9. The display device of claim 8, wherein the at least one stud bump directly contacts a top surface and a side surface of the at least one of the stud pad patterns, and
the at least one stud bump directly contacts the side surface of the at least one inorganic layer exposed through the stud hole.

10. The display device of claim 8, wherein the at least one stud bump is ultrasonically bonded to the at least one of the stud pad patterns.

11. The display device of claim 2, wherein at least one of the input pad electrodes, at least one of the output pad electrodes, and at least one of the stud pad patterns are located on a same layer.

12. The display device of claim 2, wherein the driving integrated circuit includes:

an output bump area overlapping the output pad area in the thickness direction and including output bumps; and an input bump area overlapping the input pad area in the thickness direction and including input bumps, and the at least one stud bump area is located outside the output bump area and the input bump area in a plan view.

13. The display device of claim 12, wherein a shape of the driving integrated circuit in a plan view is a rectangular shape including long sides extending in a first direction and short sides extending in a second direction intersecting the first direction, and the at least one stud bump area is located between the output bump area and a short side of the driving integrated circuit in a plan view.

14. The display device of claim 13, wherein the at least one stud bump area includes stud bump areas, a shape of the driving integrated circuit in a plan view has four corners formed by the long sides and the short sides, and the stud bump areas are located adjacent to the four corners.

15. The display device of claim 13, wherein a shape of the driving integrated circuit in a plan view includes edges located between one of the long sides and one of the short sides adjacent to each other and extending in a direction different from the one of the long sides and the one of the short sides, the at least one stud bump area includes stud bump areas, and the stud bump areas are located adjacent to the edges.

16. The display device of claim 15, wherein each one of the edges has a round shape.

17. The display device of claim 12, wherein at least one of the input bumps and at least one of the input pad electrodes directly contact each other, and a non-conductive adhesive member is disposed between the at least one of the input bumps and another one of the input bumps adjacent thereto and between the at least one of the input pad electrodes and another of the input pad electrodes adjacent thereto.

18. A display device comprising:

a display area including pixels;

a first pad area adjacent to the display area; and a second pad area farther from the display area than the first pad area in a plan view, wherein:

the first pad area includes:

an output pad area adjacent to the display area and including output pad electrodes;

an input pad area located below the output pad area in a plan view and including input pad electrodes; and a stud pad area located at an edge of the first pad area and including one or more stud pad electrodes, and the one or more stud pad electrodes include stud pad patterns separated from each other with a separation space between the one or more stud pad electrodes in a plan view, the stud pad patterns are arranged in a closed loop shape in a plan view, the output pad area includes at least one resistance measurement pad, the second pad area includes at least one resistance test point pad, and the resistance measurement pad and the resistance test point pad are electrically connected through a resistance measurement line.

19. The display device of claim 18, wherein the at least one resistance measurement pad is disposed between the output pad electrodes in a plan view, and the at least one resistance test point pad is disposed between the input pad electrodes in a plan view.

20. The display device of claim 18, wherein the stud pad patterns have a symmetrical shape with respect to a direction in a plan view.

21. The display device of claim 1, wherein the stud pad patterns include portions that protrude outward from the edge portion of the at least one stud bump in the plan view.

* * * * *